(12) United States Patent
Fukuzumi et al.

(10) Patent No.: US 8,237,211 B2
(45) Date of Patent: *Aug. 7, 2012

(54) NON-VOLATILE SEMICONDUCTOR STORAGE DEVICE AND METHOD OF MANUFACTURING THE SAME

(75) Inventors: Yoshiaki Fukuzumi, Yokohama (JP); Ryota Katsumata, Yokohama (JP); Masaru Kito, Yokohama (JP); Hiroyasu Tanaka, Tokyo (JP); Masaru Kidoh, Komae (JP); Yosuke Komori, Yokohama (JP); Megumi Ishiduki, Yokohama (JP); Akihiro Nitayama, Yokohama (JP); Hideaki Aochi, Kawasaki (JP); Hitoshi Ito, Yokkaichi (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

This patent is subject to a terminal disclaimer.

(21) Appl. No.: 12/556,242

(22) Filed: Sep. 9, 2009

(65) Prior Publication Data

US 2010/0096682 A1 Apr. 22, 2010

(30) Foreign Application Priority Data

Oct. 20, 2008 (JP) .................................. 2008-269804

(51) Int. Cl.
*H01L 29/788* (2006.01)

(52) U.S. Cl. ........ 257/315; 257/316; 257/317; 257/318; 257/319; 257/320; 257/321; 257/322

(58) Field of Classification Search ........... 257/315–322
See application file for complete search history.

(56) References Cited

U.S. PATENT DOCUMENTS

| 5,599,724 | A | | 2/1997 | Yoshida | |
|---|---|---|---|---|---|
| 5,707,885 | A | | 1/1998 | Lim | |
| 5,990,509 | A | * | 11/1999 | Burns et al. | 257/296 |
| 6,127,209 | A | * | 10/2000 | Maeda et al. | 438/151 |
| 7,271,063 | B2 | * | 9/2007 | Chung-Zen | 438/257 |

(Continued)

FOREIGN PATENT DOCUMENTS

JP 2007-266143 10/2007

(Continued)

OTHER PUBLICATIONS

U.S. Appl. No. 12/679,991, filed Mar. 25, 2010, Fukuzumi et al.

(Continued)

*Primary Examiner* — Eugene Lee
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A non-volatile semiconductor storage device has a memory string including a plurality of electrically rewritable memory cells connected in series. The non-volatile semiconductor storage device also has a protruding layer formed to protrude upward with respect to a substrate. The memory string includes: a plurality of first conductive layers laminated on the substrate; a first semiconductor layer formed to penetrate the plurality of first conductive layers; and an electric charge storage layer formed between the first conductive layers and the first semiconductor layer, and configured to be able to store electric charges. Each of the plurality of first conductive layers includes: a bottom portion extending in parallel to the substrate; and a side portion extending upward with respect to the substrate along the protruding layer at the bottom portion. The protruding layer has a width in a first direction parallel to the substrate that is less than or equal to its length in a lamination direction.

13 Claims, 30 Drawing Sheets

U.S. PATENT DOCUMENTS

| | | | |
|---|---|---|---|
| 7,821,045 B2 * | 10/2010 | Tang et al. | 257/261 |
| 7,910,973 B2 * | 3/2011 | Sakaguchi et al. | 257/298 |
| 7,936,004 B2 * | 5/2011 | Kito et al. | 257/324 |
| 7,982,260 B2 * | 7/2011 | Fukuzumi et al. | 257/324 |
| 7,994,588 B2 * | 8/2011 | Yin et al. | 257/390 |
| 8,017,991 B2 * | 9/2011 | Kim et al. | 257/318 |
| 2005/0056879 A1 * | 3/2005 | Lee et al. | 257/314 |
| 2005/0127427 A1 * | 6/2005 | Lee et al. | 257/314 |
| 2005/0199937 A1 * | 9/2005 | Chang | 257/314 |
| 2007/0252201 A1 * | 11/2007 | Kito et al. | 257/331 |
| 2007/0290253 A1 * | 12/2007 | Kito et al. | 257/315 |
| 2008/0099819 A1 | 5/2008 | Kito et al. | |
| 2008/0171406 A1 * | 7/2008 | Orimoto et al. | 438/129 |
| 2008/0173933 A1 * | 7/2008 | Fukuzumi et al. | 257/324 |
| 2009/0261398 A1 * | 10/2009 | Chien et al. | 257/316 |
| 2010/0096682 A1 * | 4/2010 | Fukuzumi et al. | 257/314 |
| 2010/0181612 A1 * | 7/2010 | Kito et al. | 257/319 |
| 2011/0127597 A1 * | 6/2011 | Fukuzumi et al. | 257/314 |

FOREIGN PATENT DOCUMENTS

| | | |
|---|---|---|
| JP | 2009-146954 | 7/2009 |
| WO | WO 2009/075370 A1 | 6/2009 |

OTHER PUBLICATIONS

U.S. Appl. No. 12/851,054, filed Aug. 5, 2010, Katsumata et al.

U.S. Appl. No. 12/851,002, filed Aug. 5, 2010, Katsumata et al.

* cited by examiner

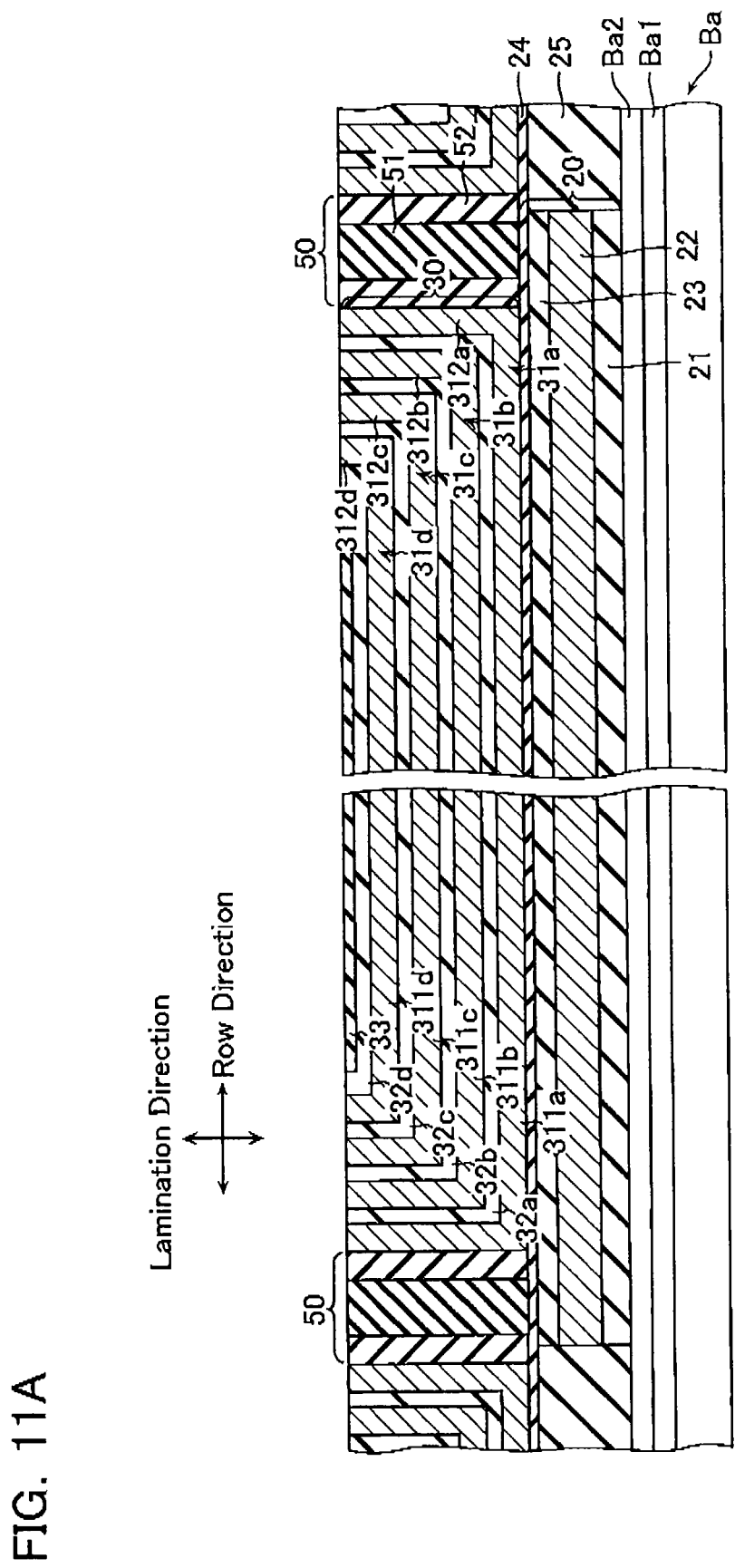

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2008-269804, filed on Oct. 20, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although increase in memory storage capacity has been mainly achieved by reducing the dimension for each device (refinement), recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, a large number of semiconductor storage devices have been proposed recently where memory cells are arranged in a three-dimensional manner to achieve improved integration of memory devices (see, for example, Japanese Patent Laid-Open No. 2007-266143, U.S. Pat. No. 5,599,724, and U.S. Pat. No. 5,707,885).

One of the conventional semiconductor storage devices where memory cells are arranged in a three-dimensional manner uses transistors with a cylinder-type structure (see, the patent documents listed above). Those semiconductor storage devices using transistors with the cylinder-type structure are provided with multiple laminated conductive layers (word-line conductive layers) corresponding to gate electrodes, and pillar-like columnar semiconductors. Each of the columnar semiconductor layers serves as a channel (body) part of each of the transistors. Memory gate insulation layers that can store electric charges are provided around the columnar semiconductor layers. Such a configuration including laminated conductive layers, columnar semiconductors, and memory gate insulation layers is referred to as a "memory string".

The semiconductor storage devices with such memory strings have laminated conductive layers formed in a stepwise manner in relation to each other, at respective ends in a predetermined direction parallel to the substrate. Furthermore, contact layers (contact plugs) extending from above the laminated conductive layers are formed on the top surfaces of the stepwise ends of the laminated conductive layers. The contact layers are provided to connect the laminated conductive layers with the conductive layers formed above the laminated conductive layers. This configuration is more advantageous in view of the costs because it does not require any lithography steps that would otherwise be critical in the manufacturing process. However, the contact layers have uneven depths because they are formed to reach the laminated conductive layers formed in a stepwise manner. It is thus desirable that an etching stopper material or the like is deposited on the stepwise ends of the laminated conductive layers to ensure that apertures with uneven depths are formed at a time. However, it is necessary to provide larger step widths of the stepwise ends, corresponding to the additional film thickness of the etching stopper material. That is, this has hampered further reduction in area occupied by the entire semiconductor storage devices (the entire chip area).

SUMMARY OF THE INVENTION

One aspect of the present invention provides a non-volatile semiconductor storage device comprising a memory string including a plurality of electrically rewritable memory cells connected in series, the non-volatile semiconductor storage device further comprising: a protruding layer formed to protrude upward with respect to a substrate, the memory string comprising: a plurality of first conductive layers laminated on the substrate and functioning as control electrodes of the memory cells; a first semiconductor layer formed to penetrate the plurality of first conductive layers and functioning as a body of each of the memory cells; and an electric charge storage layer formed between the first conductive layers and the first semiconductor layer, and configured to be able to store electric charges to retain data of the memory cells, each of the plurality of first conductive layers comprising: a bottom portion extending in parallel to the substrate; and a side portion extending upward with respect to the substrate along the protruding layer at the bottom portion, the protruding layer having a width in a first direction parallel to the substrate that is less than or equal to its length in a lamination direction.

Another aspect of the present invention provides a non-volatile semiconductor storage device comprising a memory string including a plurality of electrically rewritable memory cells connected in series, comprising: a protruding layer formed to protrude upward with respect to a substrate, the memory string comprising: a plurality of first conductive layers laminated on the substrate and functioning as control electrodes of the memory cells; a first semiconductor layer formed to penetrate the plurality of first conductive layers and functioning as a body of each of the memory cells; and an electric charge storage layer formed between the first conductive layers and the first semiconductor layer, and configured to be able to store electric charges to retain data of the memory cells, each of the plurality of first conductive layers comprising: a bottom portion extending in parallel to the substrate; and a side portion extending upward with respect to the substrate along the protruding layer at the bottom portion, the protruding layer being formed in a columnar shape, and the side portion being formed in a cylindrical shape to surround the protruding layer.

The other aspect of the present invention provides a method of manufacturing a non-volatile semiconductor storage device having a memory string including a plurality of electrically rewritable memory cells connected in series, the method comprising: forming a first protruding layer, the first protruding layer having a width in a first direction parallel to a substrate that is less than or equal to its length in a lamination direction and protruding upward with respect to the substrate; laminating a plurality of first conductive layers on the substrate to cover the first protruding layer; and flattening the plurality of laminated first conductive layers to a top surface of the first protruding layer.

BRIEF DESCRIPTION OF THE DRAWINGS

FIG. 11A is a cross-sectional view of the non-volatile semiconductor storage device 100 in the manufacturing process according to the first embodiment;

FIG. 17C is a schematic top plan view illustrating the memory transistor layer 30B, contact layers 72a, and wiring layers 76a;

DETAILED DESCRIPTION OF THE EMBODIMENTS

Embodiments of a non-volatile semiconductor storage device according to the present invention will be described below with reference to the accompanying drawings.

First Embodiment

Figure 1:
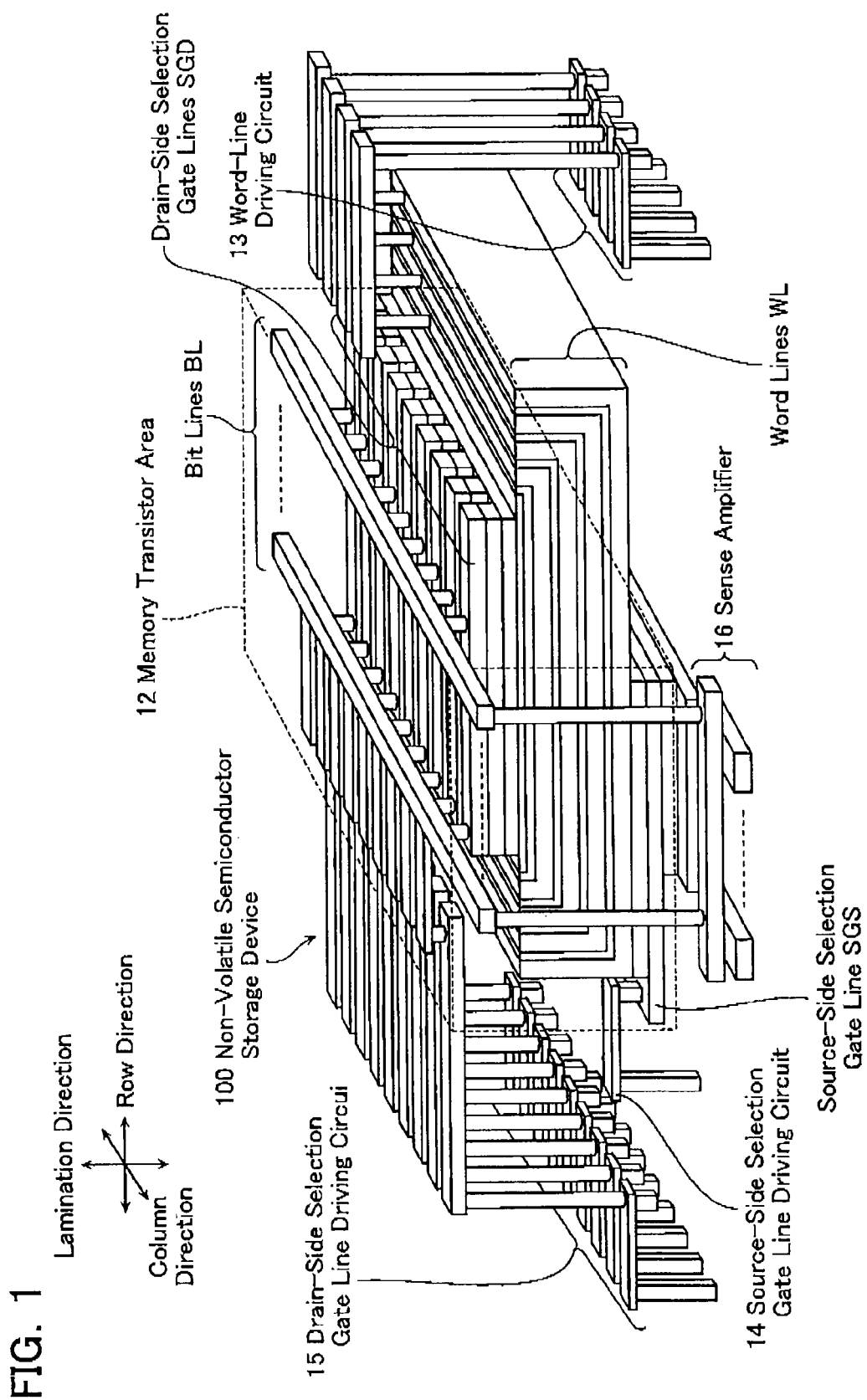
FIG. 1 is a schematic diagram illustrating a configuration of a non-volatile semiconductor storage device 100 according to a first embodiment of the present invention.

Configuration of Non-Volatile Semiconductor Storage Device 100 in First Embodiment FIG. 1 schematically illustrates a non-volatile semiconductor storage device 100 according to a first embodiment of the present invention. As illustrated in FIG. 1, the non-volatile semiconductor storage device 100 of the first embodiment mainly comprises: a memory transistor area (first area) 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines (SGD). The sense amplifier 16 amplifies a potential read from a memory transistor. In addition to this, the non-volatile semiconductor storage device 100 of the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 of the first embodiment, the memory transistors included in the memory transistor area 12 are formed by lamination of a plurality of semiconductor layers. In addition, as illustrated in FIG. 1, the bottom portions of the word lines WL in each layer is formed to expand in a two-dimensional manner in the horizontal direction. The bottom portions of the word lines WL in each layer have a planar plate-like structure of the same layer. The side portions of the word lines WL in each layer are formed to extend upward and align in the horizontal direction at the respective ends.

Figure 2:
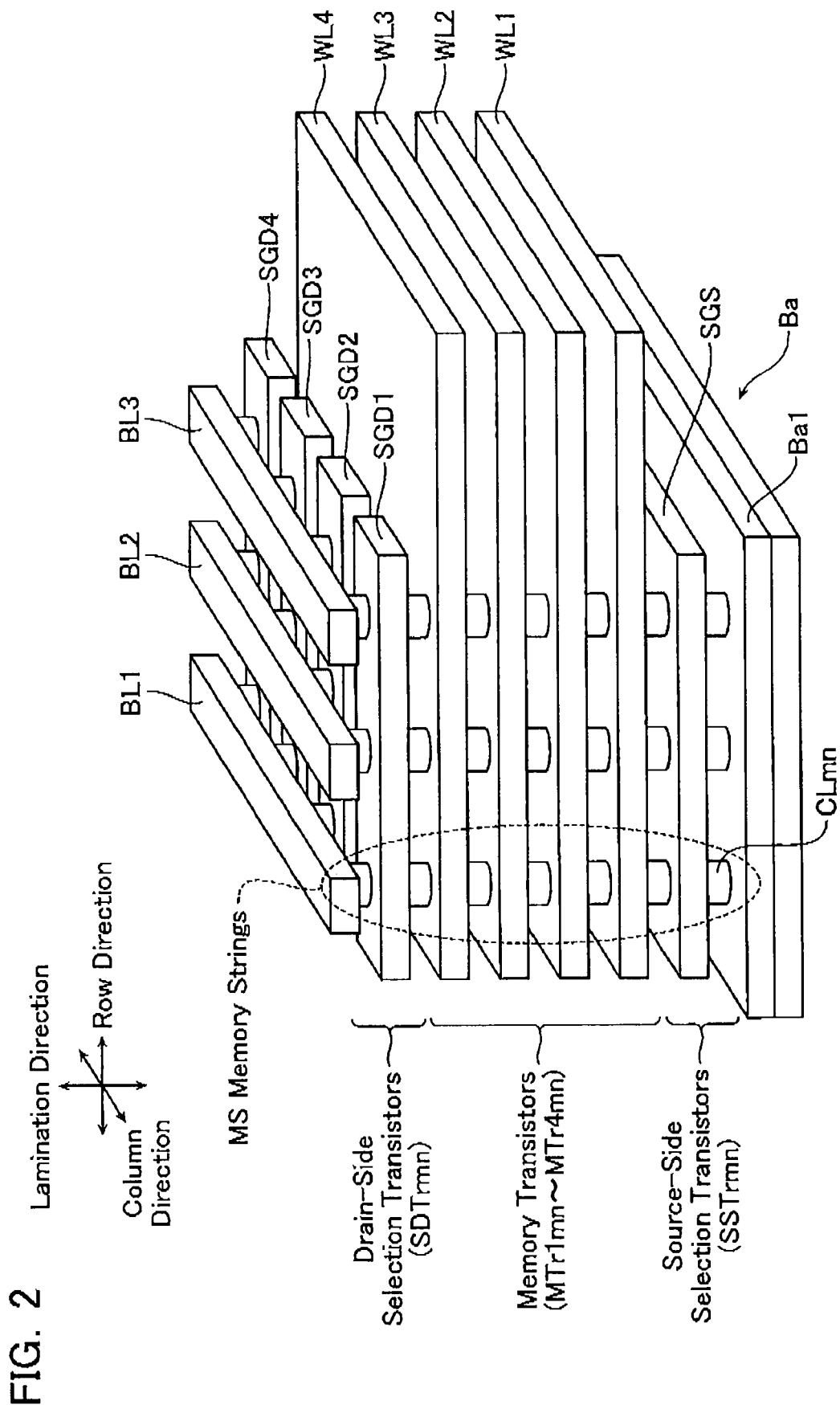
FIG. 2 is a perspective view schematically illustrating a part of the memory transistor area 12 in the non-volatile semiconductor storage device 100 according to the first embodiment.

FIG. 2 is a perspective view schematically illustrating a part of the memory transistor area 12 in the non-volatile semiconductor storage device 100 of the first embodiment. According to the first embodiment, the memory transistor area 12 has m×n (where m and n are natural numbers) memory strings MS, each of which includes memory transistors MTr1$mn$ to MTr4$mn$ as well as a source-side selection transistor SDTrmn and a drain-side selection transistor SDTrmn. In FIG. 2, given that m=3, n=4.

In each of the memory strings MS, the word lines WL1 to WL4 connected to the gates of the memory transistors MTr1$mn$ to MTr4$mn$ are formed with the same conductive film and used in common therein. That is, in each of the memory strings MS, all gates of the memory transistor MTr1$mn$ are connected to the word line WL1. In addition, in each of the memory strings MS, all gates of the memory transistor MTr1$mn$ are connected to the word line WL2. In addition, in each of the memory strings MS, all gates of the memory transistor MTr3$mn$ are connected to the word line WL3. In addition, in each of the memory strings MS, all gates of the memory transistor MTr4$mn$ are connected to the word line WL4. As illustrated in FIGS. 1 and 2, in the non-volatile semiconductor storage device 100 of the first embodiment, each of the word lines WL1 to WL4 is formed to expand in a two-dimensional manner in a horizontal direction parallel to the semiconductor substrate Ba. In addition, the bottom portions of the word lines WL1 to WL4 are arranged substantially vertical to the respective memory strings MS. Wherein, the row direction represents a direction orthogonal to the vertical direction and the column direction represents another orthogonal to the vertical direction and the row direction.

Each of the memory strings MS has columnar semiconductors CLmn (in the case of FIG. 2, m=1 to 3, n=1 to 4) provided on an n$^+$ area (i.e., Ba2, as described below) that is formed on a P-well area Ba1 on a semiconductor substrate Ba. The columnar semiconductors CLmn are formed in a vertical direction to the semiconductor substrate Ba and arranged in a matrix form on the respective surfaces of the semiconductor substrate Ba and the bottom portions of the word lines WL1 to WL4. That is, the memory strings MS are also arranged in a matrix form within a plane vertical to the columnar semiconductors CLmn. Note that the columnar semiconductors CLmn may be round columnar or prismatic in shape. In addition, the columnar semiconductors CLmn include terraced columnar semiconductors.

Furthermore, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulation films (not illustrated) and are included in respective drain-side selection transistors SDTrmn. The drain-side selection gate lines SGD are insulated and isolated from each other and, unlike the word lines WL1 to WL4, formed in lines extending in the row direction and repeatedly provided in the column direction. In addition, columnar semiconductors CLmn are provided to penetrate the center in the column direction of the drain-side selection gate lines SGD.

Furthermore, as illustrated in FIG. 2, provided on the lower portions of the memory strings MS is a source-side selection gate line SGS, which contacts the columnar semiconductors CLmn via insulation films (not illustrated) and is included in a source-side selection transistor SSTrmn. As with the bottom portions of the word lines WL1 to WL4, the source-side selection gate line SGS is formed to expand in a two-dimensional manner in the horizontal direction. Note that, in addition to the structure as illustrated in FIG. 2, the source-side selection gate line SGS may be formed in strips extending in the row direction and repeatedly provided in the column direction.

Figure 3:
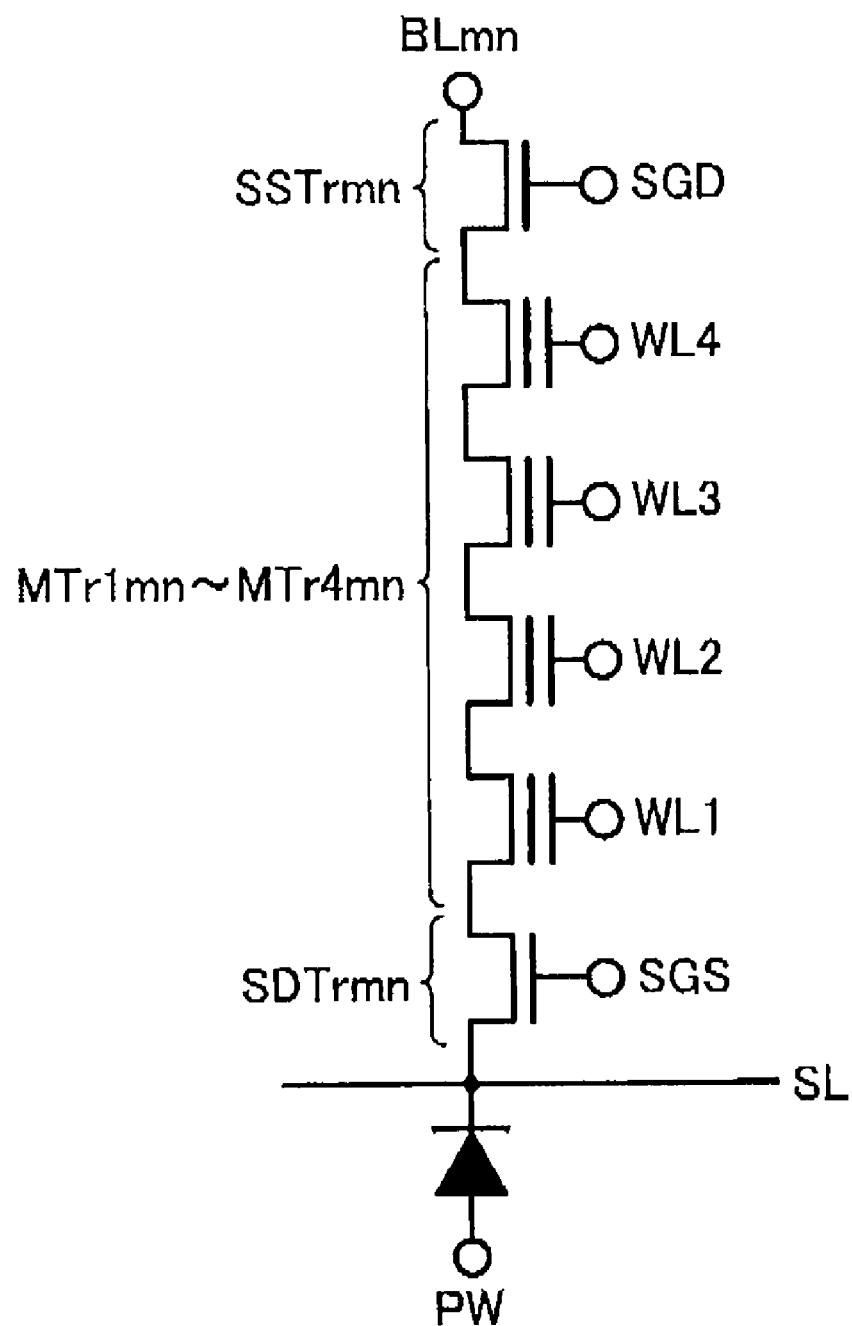
FIG. 3 is a circuit diagram illustrating one memory string MS according to the first embodiment.

Referring now to FIGS. 2 and 3, the circuit configuration and operation of the memory strings MS of the first embodiment will be described below. FIG. 3 is a circuit diagram illustrating one memory string MS according to the first embodiment.

As illustrated in FIGS. 2 and 3, in the first embodiment, each of the memory strings MS has four memory transistors MTr1$mn$ to MTr4$mn$ as well as a source-side selection transistor SSTrmn and a drain-side selection transistor SDTrmn. These four memory transistors MTr1$mn$ to MTr4$mn$ as well as the source-side selection transistor SSTrmn and the drain-side selection transistor SDTrmn are connected in series to each other (see FIG. 3). According to the first embodiment, in each of the memory strings MS, a columnar semiconductor CLmn is formed on an n$^+$ area that is formed on the p$^-$ type area (P-well area) Ba1 on the semiconductor substrate Ba.

In addition, a source line SL (an n$^+$ area formed on the P-well area Ba1 on the semiconductor substrate Ba) is connected to the source of each source-side selection transistor SSTrmn. Furthermore, a bit line BL is connected to the drain of each drain-side selection transistor SDTrmn.

Each of the memory transistors MTrmn has a columnar semiconductor CLmn, an electric charge storage layer formed to surround the columnar semiconductor CLmn, and a word line WL formed to surround the electric charge storage layer. Each word line WL functions as a control gate electrode of the corresponding memory transistor MTrmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling electric charges of the electric charge storage layer in a predetermined memory transistor MTrmn.

Figure 4:
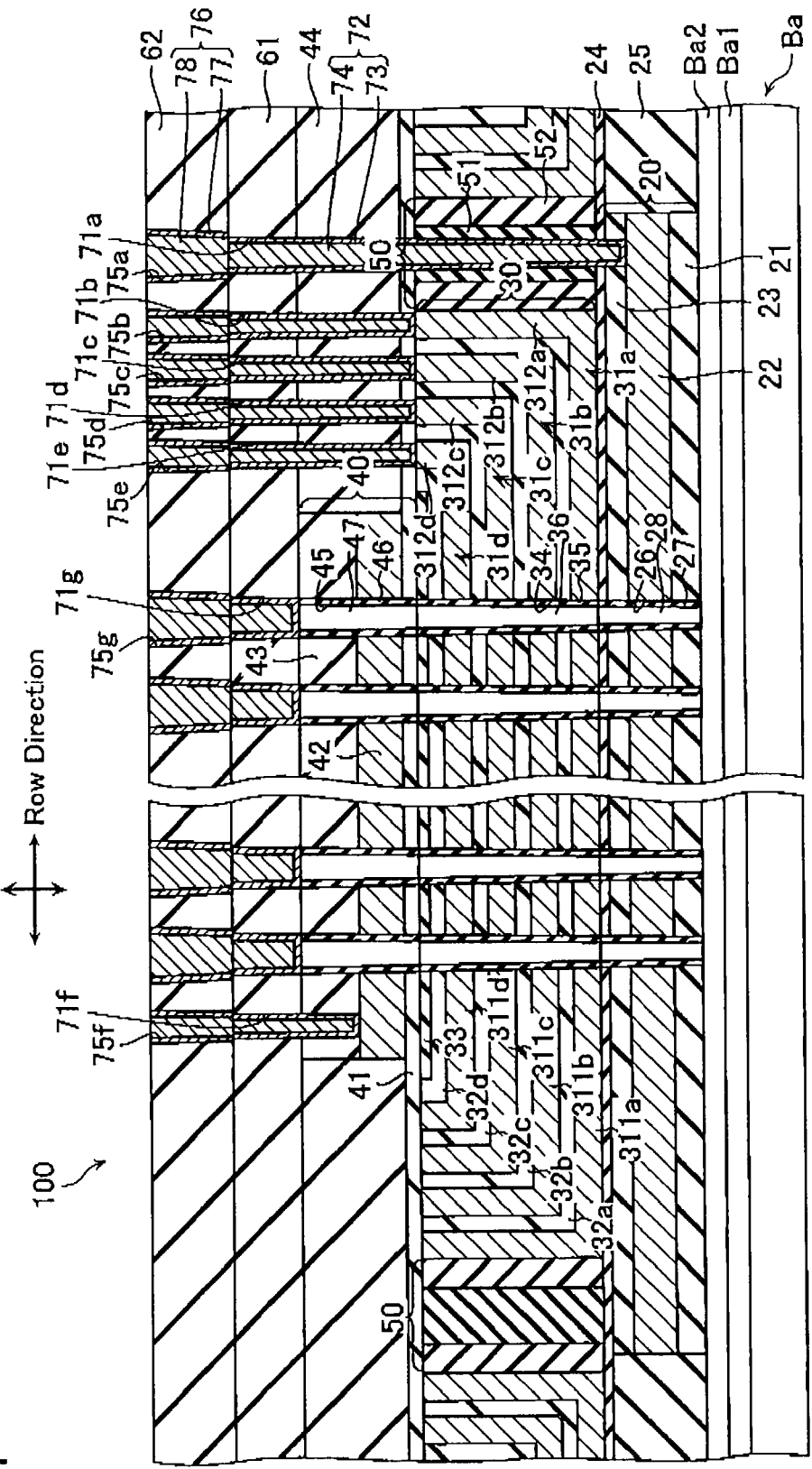
FIG. 4 is a cross-sectional view of the non-volatile semiconductor storage device 100 of the first embodiment.

Specific Configuration of Non-Volatile Semiconductor Storage Device 100 in First Embodiment Referring now to FIG. 4, a further specific configuration of the non-volatile semiconductor storage device 100 of the first embodiment will be described below. FIG. 4 is a cross-sectional view in the row direction of the non-volatile semiconductor storage device of the first embodiment.

The non-volatile semiconductor storage device 100 has a source-side selection transistor layer 20, a memory transistor layer 30, and a drain-side selection transistor layer 40 on the semiconductor substrate Ba, in the stated order. The source-side selection transistor layer 20 functions as source-side selection transistors SSTrmn. The memory transistor layer 30 functions as memory transistors MTrmn. The drain-side selection transistor layer 40 functions as drain-side selection transistors SDTrmn. The memory strings MS are included in the source-side selection transistor layer 20, the memory transistor layer 30, and the drain-side selection transistor layer 40.

Figure 5:
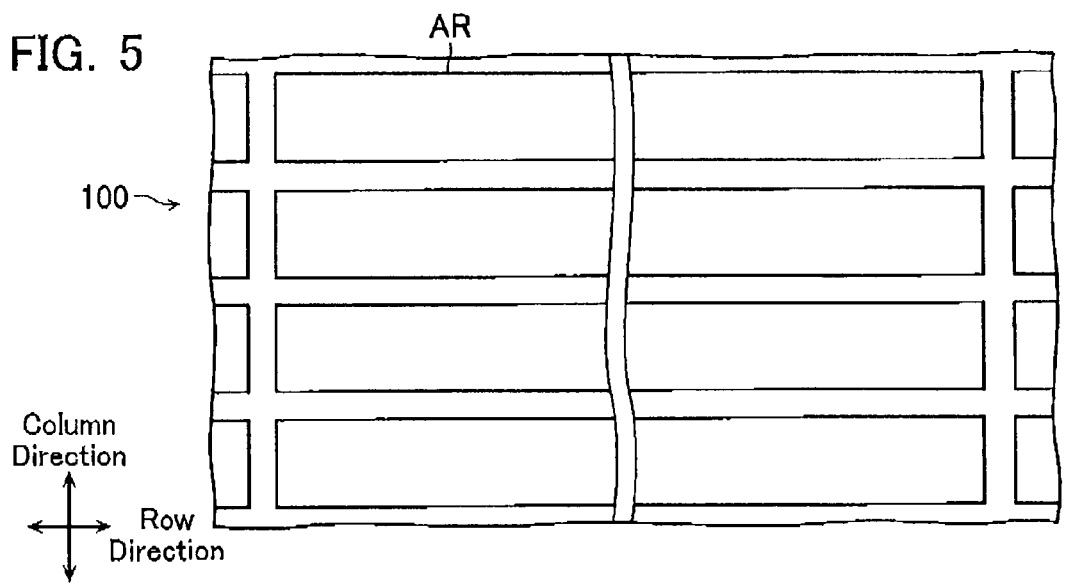
FIG. 5 is a top plan view illustrating formation areas AR of respective conductive layers included in the source-side selection transistor layer 20, the memory transistor layer 30, and the drain-side selection transistor layer 40, in the non-volatile semiconductor storage device 100 of the first embodiment.

Referring now to FIG. 5, a top plan view of formation areas AR in the non-volatile semiconductor storage device 100 is illustrated where respective conductive layers are formed that are included in the source-side selection transistor layer 20, the memory transistor layer 30, and the drain-side selection transistor layer 40. As illustrated in FIG. 5, the formation areas AR are formed at a predetermined pitch in the column and row directions. The formation areas AR are formed in rectangular shapes extending in the row direction, as viewed from above.

As illustrated in FIG. 4, the non-volatile semiconductor storage device 100 has the p⁻ type area (P-well area) Ba1 the semiconductor substrate Ba. The non-volatile semiconductor storage device 100 also has the n⁺ area (source line area) Bat on the p⁻ type area Ba1.

Figure 6:
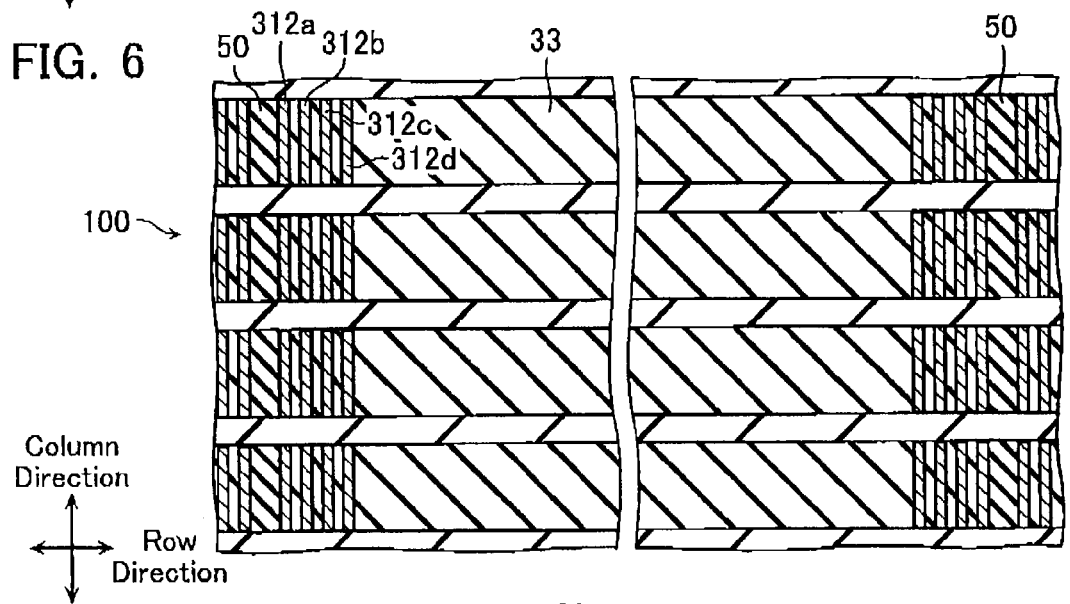
FIG. 6 is a schematic top plan view of the memory transistor layer 30 and the protruding layers 50 according to the first embodiment.

The non-volatile semiconductor storage device 100 has protruding layers 50 in the same layer as the memory transistor layer 30. FIG. 6 is a schematic top plan view of the memory transistor layer 30 and the protruding layers 50. As illustrated in FIG. 6, the protruding layers 50 are formed at a predetermined pitch in the row and column directions. The protruding layers 50, which are rectangular as viewed from above, are formed to protrude upward with respect to the semiconductor substrate Ba. The protruding layers 50 are formed in rectangular shapes taking the column direction as the longitudinal direction, as viewed from above. Each protruding layer 50 has a width in the row direction that is less or equal to its length in the lamination direction (see FIG. 4). That is, the aspect ratio is less or equal to "1". For example, according to the non-volatile semiconductor storage device 100, the protruding layers 50 occupy 1% or less of the entire chip area.

Each protruding layer 50 has a columnar layer 51 that is formed in a columnar shape, and a sidewall layer 52 that is formed on the sidewall of the columnar layer 51. The columnar layers 51 are composed of silicon oxide ($SiO_2$). The sidewall layers 52 are composed of silicon nitride (SiN).

The source-side selection transistor layer 20 has a source-side first insulation layer 21, a source-side conductive layer 22, a source-side second insulation layer 23, and a source-side isolation/insulation layer 24 that are sequentially laminated on the semiconductor substrate Ba.

The source-side first insulation layer 21, the source-side conductive layer 22, the source-side second insulation layer 23, and the source-side isolation/insulation layer 24 are each formed to expand in a two-dimensional manner in the horizontal direction parallel to the semiconductor substrate Ba. The source-side first insulation layer 21, the source-side conductive layer 22, the source-side second insulation layer 23, and the source-side isolation/insulation layer 24 are arranged separately for each predetermined area (erase unit) in the memory transistor area 12. In addition, an interlayer insulation layer 25 is provided ranging from the top of the semiconductor substrate Ba to the top surface of the source-side second insulation layer 23.

The source-side first insulation layer 21 and the source-side second insulation layer 23 are composed of silicon oxide ($SiO_2$). The source-side conductive layer 22 is composed of p⁺ type polysilicon (p-Si). The source-side isolation/insulation layer 24 is composed of silicon nitride (SiN). The interlayer insulation layer 25 is composed of silicon oxide ($SiO_2$).

In addition, source-side holes 26 are formed to penetrate the source-side isolation/insulation layer 24, the source-side second insulation layer 23, the source-side conductive layer 22, and the source-side first insulation layer 21. Source-side gate insulation layers 27 and source-side columnar semiconductor layers 28 are sequentially provided on the respective sidewalls facing the source-side holes 26.

The source-side gate insulation layers 27 are formed with silicon oxide ($SiO_2$). The source-side columnar semiconductor layers 28 are formed with polysilicon (p-Si).

Note that the configuration of the source-side conductive layer 22 in the source-side selection transistor layer 20 is restated as follows: the source-side conductive layer 22 is formed to sandwich the source-side gate insulation layers 27 with the source-side columnar semiconductor layers 28.

In addition, in the source-side selection transistor layer 20, the source-side conductive layer 22 functions as the source-side selection gate line SGS. Furthermore, the source-side conductive layer 22 functions as the control gates of the source-side selection transistors SSTrmn. The source-side columnar semiconductor layers 28 function as the bodies of the source-side selection transistors SSTrmn.

The memory transistor layer 30 has first to fourth word-line conductive layers 31a to 31d that are provided over the source-side isolation/insulation layer 24, first to fourth inter-wordline insulating layers 32a to 32d that are provided between the first to fourth word-line conductive layers 31a to 31d, as well as a memory isolation/insulation layer 33 that is laminated on the fourth inter-wordline insulating layer 32d.

The first to fourth word-line conductive layers 31a to 31d are formed in "U-shapes" (concave shapes) with upward apertures, in the cross-section in the row direction as illustrated in FIG. 4. The first to fourth word-line conductive layers 31a to 31d have first to fourth bottom portions 311a to 311d and first to fourth side portions 312a to 312d.

The first to fourth bottom portions 311a to 311d are formed to extend in parallel to the semiconductor substrate Ba. The second bottom portion 311b has a width in the row direction that is less than a width of the first bottom portion 311a in the row direction. The third bottom portion 311c has a width in the row direction that is less than a width of the second bottom portion 311b in the row direction. The fourth bottom portion 311d has a width in the row direction that is less than a width of the third bottom portion 311c in the row direction.

The first to fourth side portions 312a to 312d are formed to extend upward along the protruding layers 50 in an orthogonal direction to the semiconductor substrate Ba. Accordingly, as illustrated in FIG. 6, viewing the memory transistor layer 30 from above, the first to fourth side portions 312a to 312d are formed in strips at a predetermined pitch in the row direction. The top surfaces of the first to fourth side portions 312a to 312d are formed to align in the same plane in the horizontal direction.

The first to fourth word-line conductive layers 31a to 31d are composed of p⁺ type polysilicon (p-Si). The first to fourth inter-wordline insulating layers 32a to 32d are composed of silicon oxide ($SiO_2$). The memory isolation/insulation layer 33 is composed of silicon nitride (SiN).

In addition, the memory transistor layer 30 has memory holes 34 formed therein so as to penetrate the memory isolation/insulation layer 33, the first to fourth inter-wordline insulating layers 32a to 32d, and the first to fourth word-line conductive layers 31a to 31d. The memory holes 34 are provided at positions matching the source-side holes 26. Memory gate insulation layers and memory columnar semiconductor layers 36 are sequentially provided on the respective sidewalls of the memory holes 34.

Figure 7:
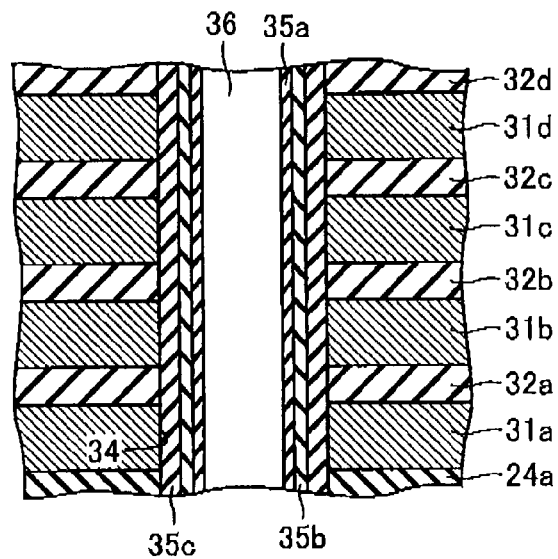
FIG. 7 is a partial enlarged view of FIG. 4.

Each of the memory gate insulation layers 35 is configured as illustrated in FIG. 7. FIG. 7 is an enlarged view of the memory transistor layer 30 illustrated in FIG. 4. As illustrated in FIG. 7, each of the memory gate insulation layers 35 has a tunnel insulation layer 35a, an electric charge storage layer 35b for accumulating electric charges, and a block insulation layer 35c that are sequentially formed on the sidewall of each of the memory columnar semiconductor layers 36. Note that the electric charge storage layers 35b are used to retain data in the memory transistors MTrmn.

The tunnel insulation layers 35a and the block insulation layers 35c are formed with silicon oxide ($SiO_2$). The electric charge storage layers 35b are formed with silicon nitride (SiN). The memory columnar semiconductor layers 36 are composed of polysilicon (p-Si). In addition, the upper portions of the memory columnar semiconductor layers 36 may be composed of $n^+$ type polysilicon.

Note that the configuration of the first to fourth word-line conductive layers 31a to 31d in the memory transistor layer 30 is restated as follows: the first to fourth word-line conductive layers 31a to 31d are formed to sandwich the tunnel insulation layers 35a, the electric charge storage layers 35b, and the block insulation layers 35c with the memory columnar semiconductor layers 36. In addition, the memory columnar semiconductor layers 36 are formed in contact with the top surfaces of the source-side columnar semiconductor layers 28 and the bottom surfaces of drain-side columnar semiconductor layers 47 described below.

In addition, in the memory transistor layer 30, the first to fourth word-line conductive layers 31a to 31d function as the word lines WL1 to WL4. Furthermore, the first to fourth word-line conductive layers 31a to 31d function as the control gates of the memory transistors MTrmn. The memory columnar semiconductor layers 36 function as the bodies of the memory transistors MTrmn.

The drain-side selection transistor layer 40 has a drain-side first insulation layer 41, a drain-side conductive layer 42, and a drain-side second insulation layer 43 that are sequentially laminated on the memory isolation/insulation layer 33.

The drain-side first insulation layer 41, the drain-side conductive layer 42, and the drain-side second insulation layer 43 are provided at positions matching the upper portions of the memory columnar semiconductor layers 36, and formed in lines extending in the row direction and repeatedly provided in the column direction. In addition, an interlayer insulation layer 44 is formed ranging from the top surface of the drain-side first insulation layer 41 to the top surface of the drain-side second insulation layer 43.

The drain-side first insulation layer 41 and the drain-side second insulation layer 43 are formed with silicon oxide ($SiO_2$). The drain-side conductive layer is formed with $p^+$ type polysilicon (p-Si). The interlayer insulation layer 44 is formed with silicon oxide ($SiO_2$).

In addition, the drain-side selection transistor layer 40 has drain-side holes 45 formed therein so as to penetrate the drain-side second insulation layer 43, the drain-side conductive layer 42, the drain-side first insulation layer 41, and the memory isolation/insulation layer 33. The drain-side holes 45 are provided at positions matching the memory holes 34. Drain-side gate insulation layers 46 and drain-side columnar Semiconductor layers 47 are sequentially provided on the sidewalls facing the drain-side holes 45.

The drain-side gate insulation layers 46 are formed with silicon oxide ($SiO_2$). The drain-side columnar semiconductor layers 47 are formed with polysilicon (p-Si). In addition, the upper portions of the drain-side columnar semiconductor layers 47 are composed of $n^+$ type polysilicon.

Note that the configuration of the drain-side conductive layer 42 in the drain-side selection transistor layer 40 is restated as follows: the drain-side conductive layer 42 is formed to sandwich the drain-side gate insulation layers 46 with the drain-side columnar semiconductor layers 47. In addition, the drain-side columnar semiconductor layers 47 are formed in contact with the top surfaces of the memory columnar semiconductor layers 36.

In addition, in the drain-side selection transistor layer 40, the drain-side conductive layer 42 functions as a drain-side selection gate line SGD. Furthermore, the drain-side conductive layer 42 functions as the control gate of a drain-side selection transistor SDTrmn. The drain-side columnar semiconductor layers 47 function as the bodies of the drain-side selection transistors SDTrmn.

Furthermore, an interlayer insulation layer 61 and another interlayer insulation layer 62 are sequentially formed on the drain-side second insulation layer 43 and the interlayer insulation layer 44. The interlayer insulation layer 61 and the interlayer insulation layer 62 are composed of silicon oxide ($SiO_2$).

In addition, the non-volatile semiconductor storage device 100 has first to seventh contact holes 71a to 71g.

Each first contact hole 71a is formed to reach the top surface of the source-side conductive layer 22. The first contact hole 71a is formed to penetrate the interlayer insulation layer 61, the interlayer insulation layer 44, the drain-side first insulation layer 41, the protruding layers 50, the source-side isolation/insulation layer 24, and the source-side second insulation layer 23.

Second to fifth contact holes 71b to 71e are formed to reach the respective top surfaces of the first to fourth side portions 312a to 312d of the first to fourth word-line conductive layers 31a to 31d. The second to fifth contact holes 71b to 71e are formed to penetrate the interlayer insulation layer 61, the interlayer insulation layer 44, and the drain-side first insulation layer 41.

Each sixth contact hole 71f is formed to reach the top surface of the drain-side conductive layer 42. The sixth contact hole 71f is formed to penetrate the interlayer insulation layer 61 and the drain-side second insulation layer 43.

Each seventh contact hole 71g is formed to reach the top surface of a drain-side columnar semiconductor layer 47. The seventh contact hole 71g is formed to penetrate the interlayer insulation layer 61.

The first to seventh contact holes 71a to 71g have contact layers 72 formed therein. Each contact layer 72 has a barrier metal layer 73 and a metal layer 74. The barrier metal layers 73 are composed of titanium (Ti)/titanium nitride (TiN). The metal layers 74 are composed of tungsten (W).

In addition, the non-volatile semiconductor storage device 100 has first to seventh trenches 75a to 75g that are provided at positions matching the first to seventh contact holes 71a to 71g and formed to penetrate the interlayer insulation layer 62. The first to seventh trenches 75a to 75g have wiring layers 76 formed therein.

Each of the first to seventh wiring layers 76 has a barrier metal layer 77 and a metal layer 78. The barrier metal layers 77 are composed of titanium (Ti)/titanium nitride (TiN). The metal layers 78 are composed of tungsten (W).

Figure 11B:
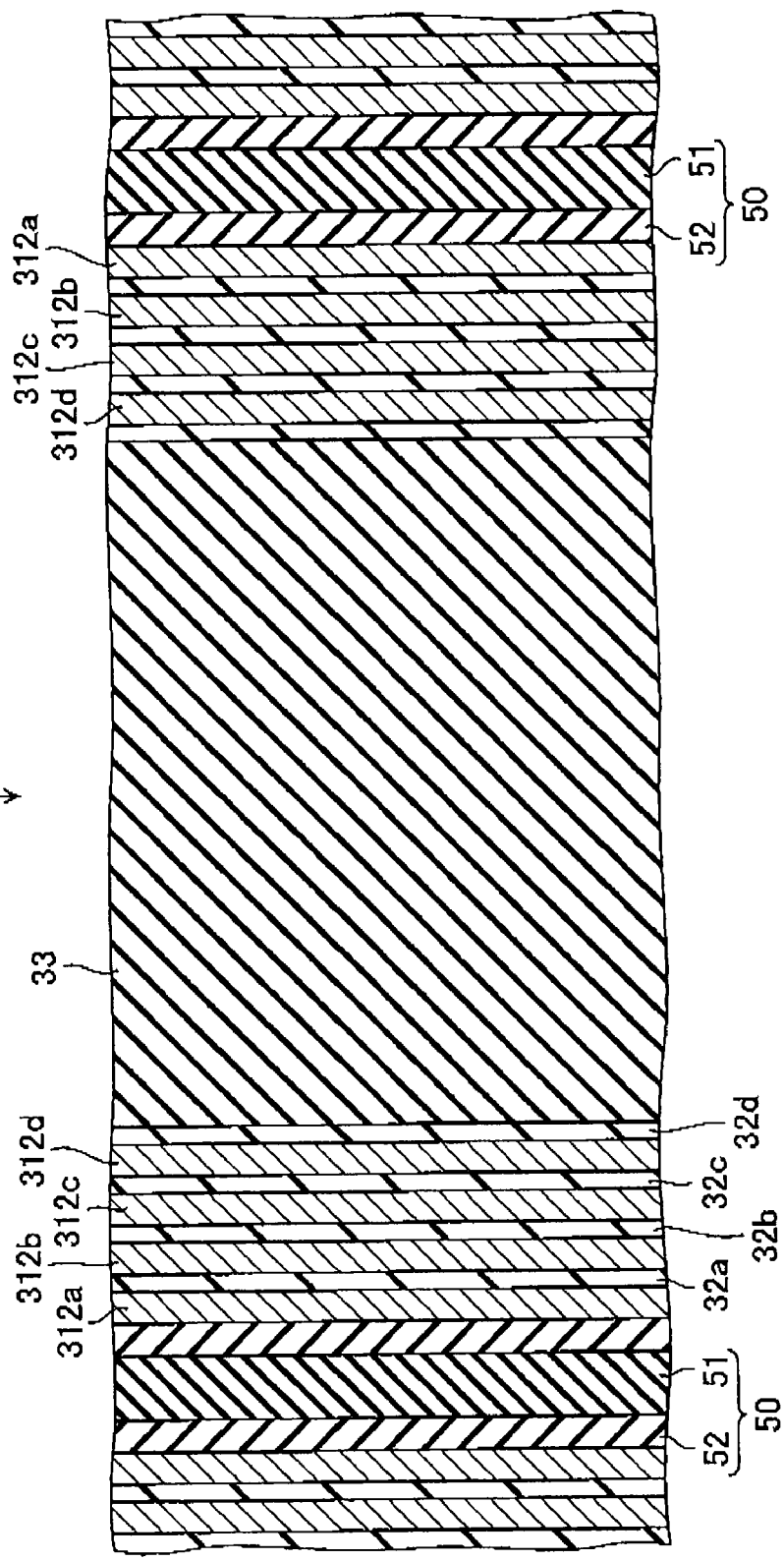
FIG. 11B is a top plan view of the non-volatile semiconductor storage device 100 in the manufacturing process according to the first embodiment.
Figure 12:
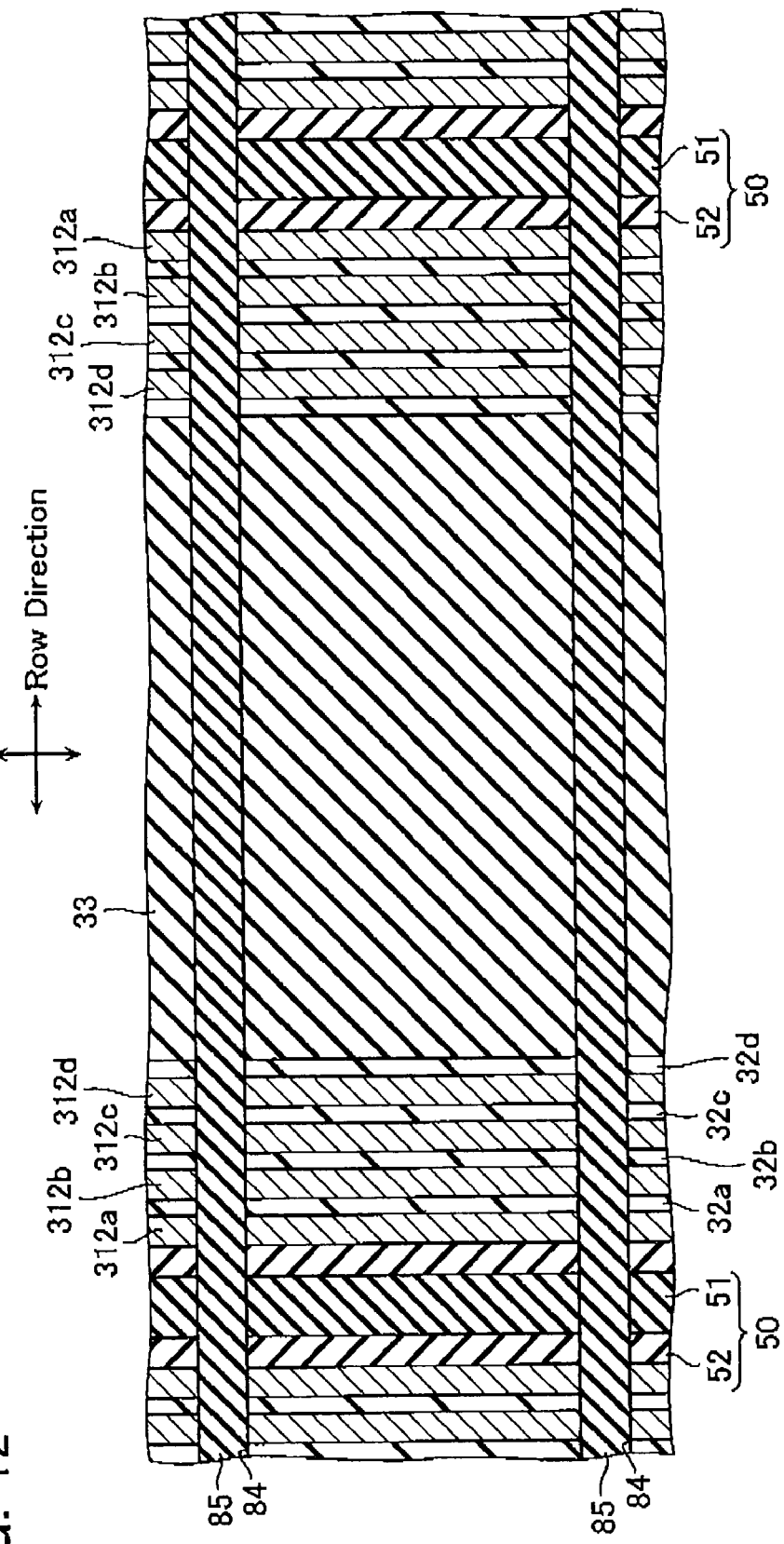
FIG. 12 is a top plan view of the non-volatile semiconductor storage device 100 in the manufacturing process according to the first embodiment.

Manufacturing Process of Non-Volatile Semiconductor Storage Device 100 in First Embodiment Referring now to FIGS. 8 to 15, a manufacturing process of the non-volatile semiconductor storage device 100 according to the first embodiment will be described below. Here, FIGS. 8, 9A, 10, 11A, and 13 to 15 are cross-sectional views in the row direction of the non-volatile semiconductor storage device 100 in the manufacturing process according to the first embodiment. FIGS. 9B, 11B and 12 are top plan view illustrating the manufacturing process of the non-volatile semiconductor storage device 100 of the first embodiment. Note that FIG. 9B is a top plan view corresponding to FIG. 9A, and FIG. 11B it a top plan view corresponding to FIG. 11A.

Figure 8:
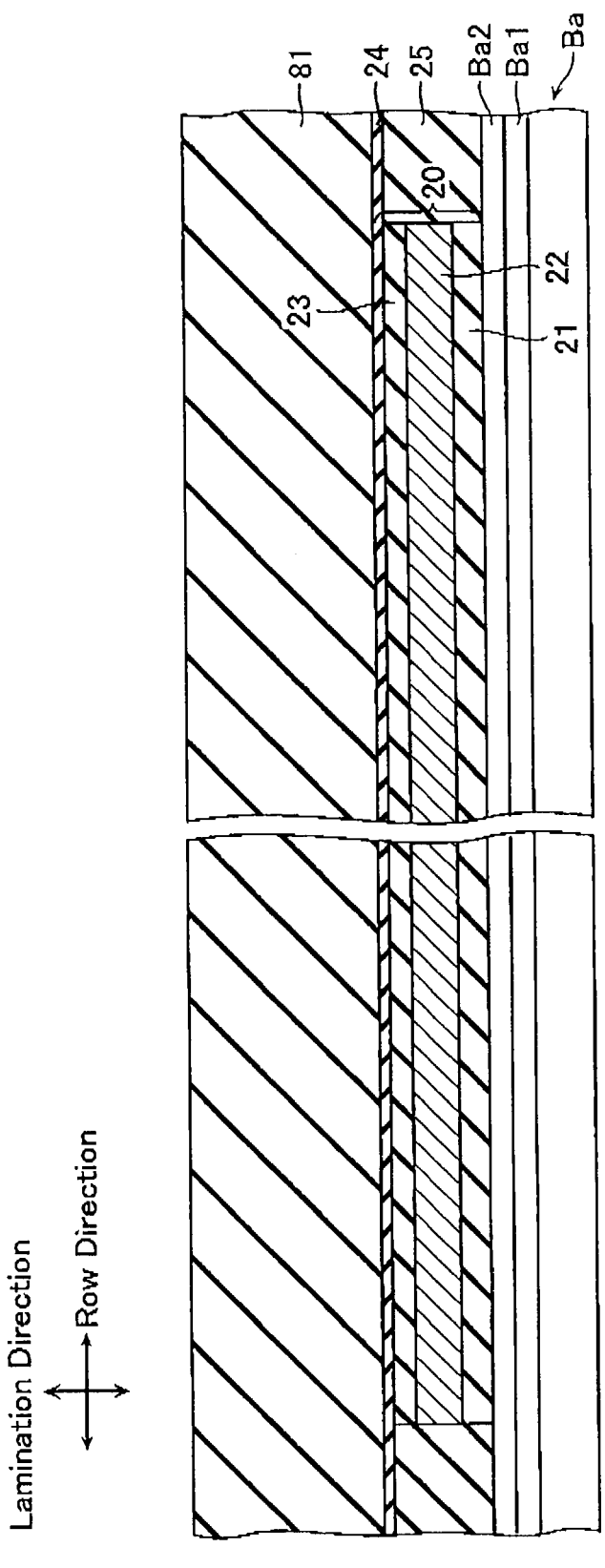
FIG. 8 is a cross-sectional view of the non-volatile semiconductor storage device 100 in a manufacturing process according to the first embodiment.

As illustrated in FIG. 8, a source-side selection transistor layer 20 is first formed, and silicon oxide ($SiO_2$) is then deposited on the source-side isolation/insulation layer 24 thereof to form a silicon oxide layer 81.

Figure 9A:
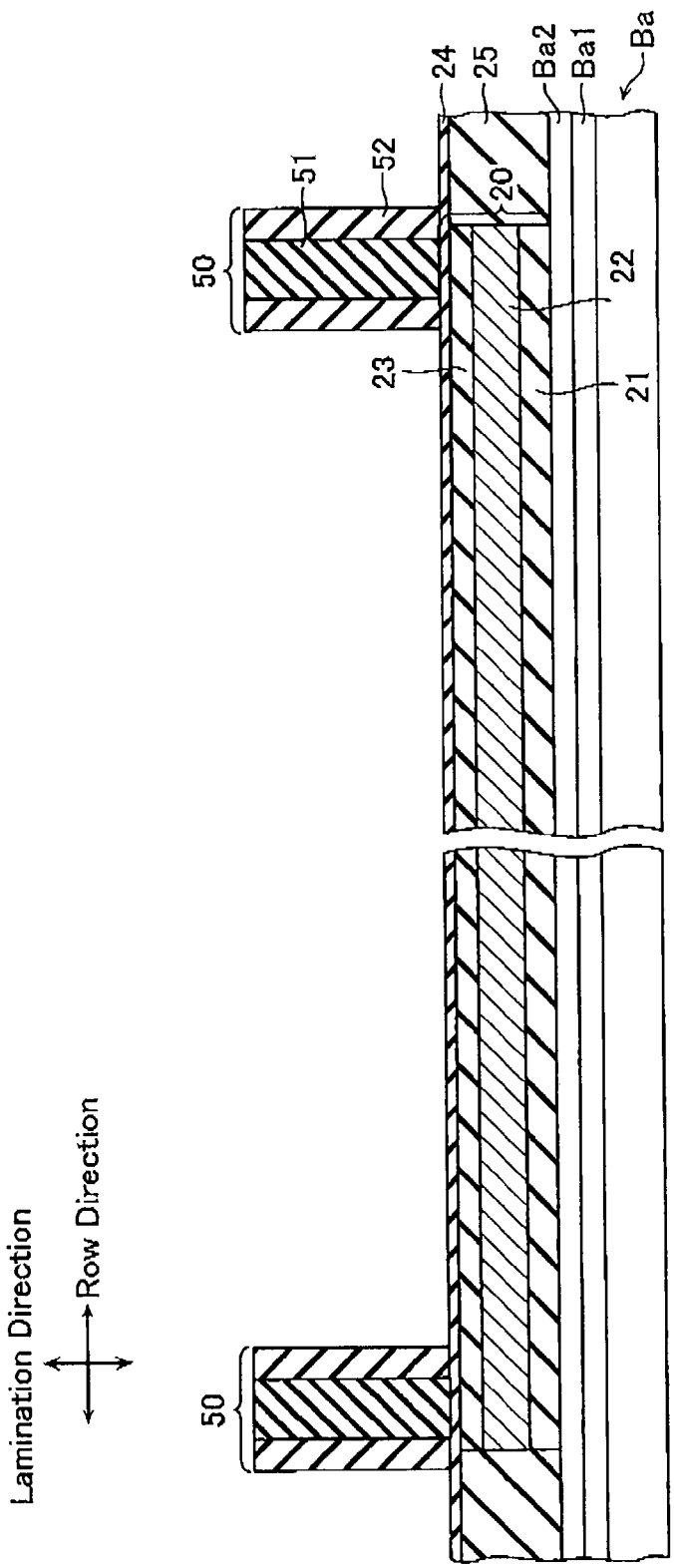
FIG. 9A is a cross-sectional view of the non-volatile semiconductor storage device 100 in the manufacturing process according to the first embodiment.
Figure 9B:
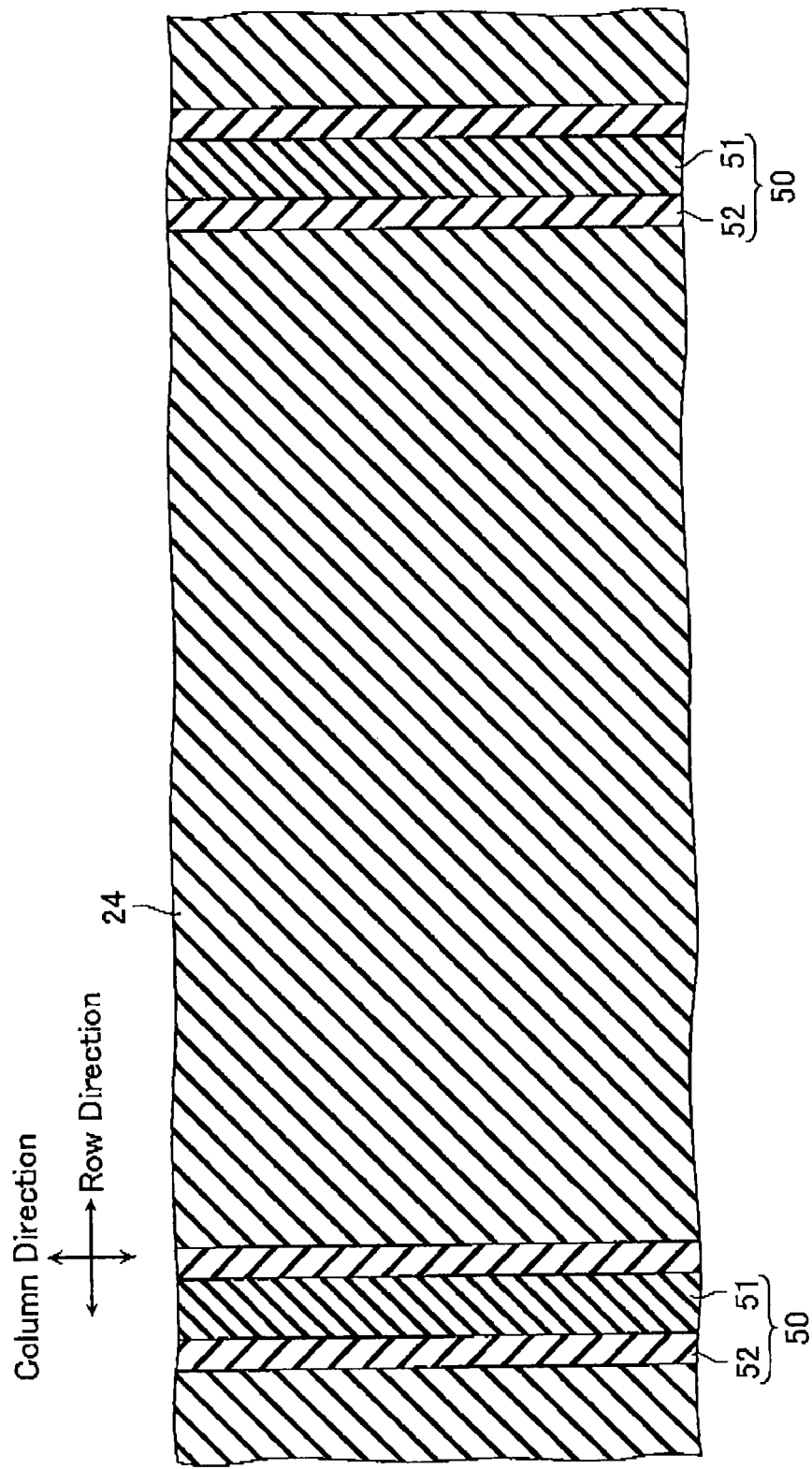
FIG. 9B is a top plan view of the non-volatile semiconductor storage device 100 in the manufacturing process according to the first embodiment.

Then, as illustrated in FIGS. 9A and 9B, the silicon oxide layer 81 is etched so that only a predetermined width of the silicon oxide layer 81 will be left at a predetermined interval in the row direction. Furthermore, silicon nitride (SiN) is formed on the sidewalls of the etched silicon oxide layers 81. Through this process, protruding layers 50 are formed. That is, the etched silicon oxide layers 81 provide columnar layers 51. The silicon nitride formed on the sidewalls of the silicon oxide layers 81 provides sidewall layers 52.

Figure 10:
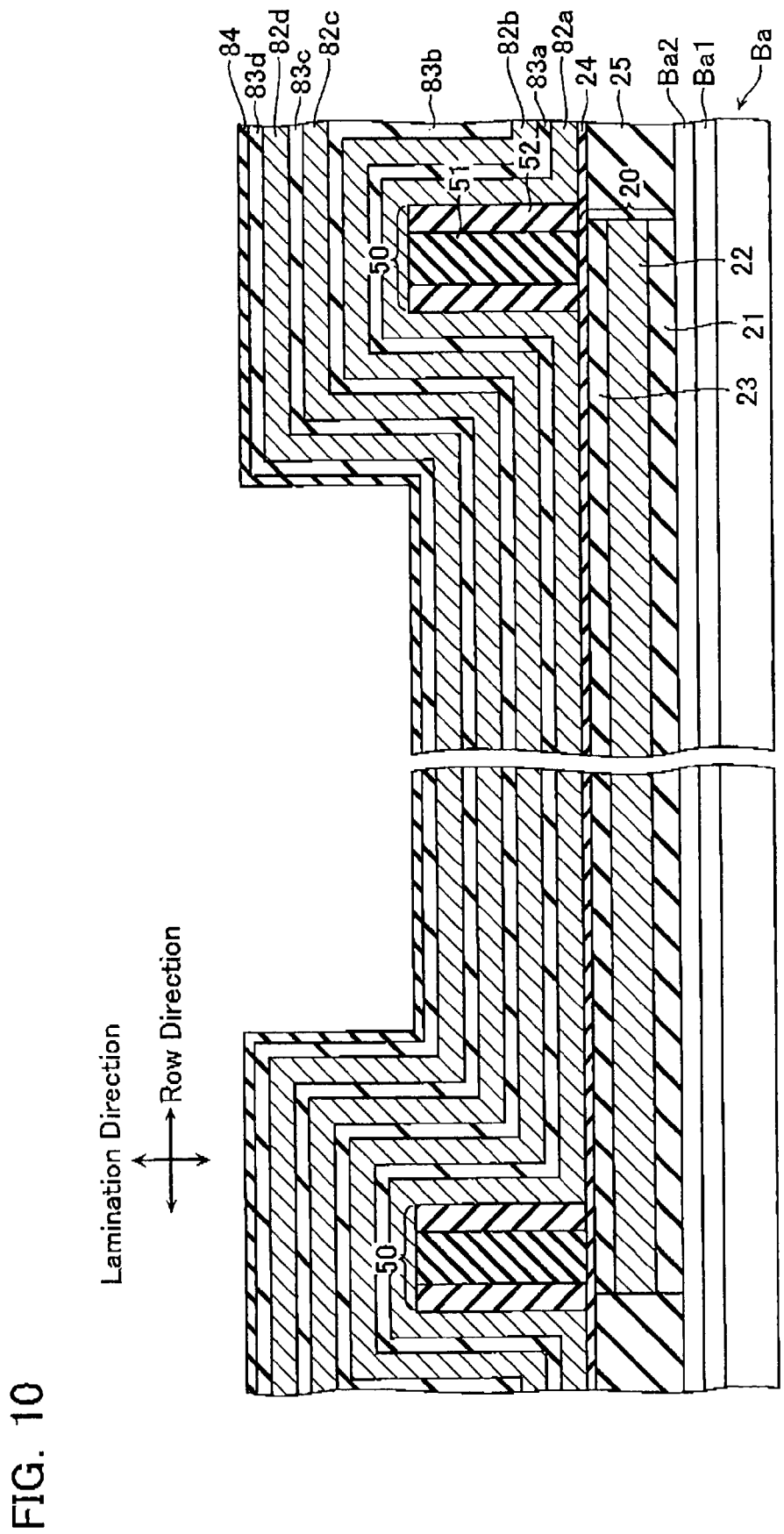
FIG. 10 is a cross-sectional view of the non-volatile semiconductor storage device 100 in the manufacturing process according to the first embodiment.

Then, as illustrated in FIG. 10, polysilicon (p-Si) and silicon oxide (SiO2) are alternately laminated over the top surface of the source-side isolation/insulation layer 24 as well as the top and side surfaces of the protruding layers 50, after which silicon nitride (SiN) is deposited thereon. Through this process, first to fourth polysilicon layers 82a to 82d, first to fourth silicon oxide layers 83a to 83d, and a silicon nitride layer 84 are formed.

Then, as illustrated in FIGS. 11A and 11B, the first to fourth polysilicon layers 82a to 82d, the first to fourth silicon oxide layer's 83a to 83d, and the silicon nitride layer 84 are polished to the top surfaces of the protruding layers 50 by Chemical Mechanical Polishing (CMP). Through this process, the first to fourth polysilicon layers 82a to 82d provide the first to fourth word-line conductive layers 31a to 31d. The first to fourth silicon oxide layers 83a to 83d provide the first to fourth inter-wordline insulating layers 32a to 32d. The silicon nitride layer 84 provides the memory isolation/insulation layer 33. Note that during the CMP process illustrated in FIGS. 11A and 11B, the sidewall layers 52 (silicon nitride) of the protruding layers 50 serve as CMP stoppers. A memory transistor layer 30 is formed through the steps illustrated in FIGS. 11A and 11B.

Then, as illustrated in FIG. 12, through trenches 84 extending in the row direction are formed at a predetermined pitch in the column direction, so as to penetrate the memory transistor layer 30, the protruding layers 50, the source-side selection transistor layer 20, and the interlayer insulation layer 25. Furthermore, silicon oxide ($SiO_2$) is deposited in the through trenches 84 to form interlayer insulation layers 85.

Figure 13:
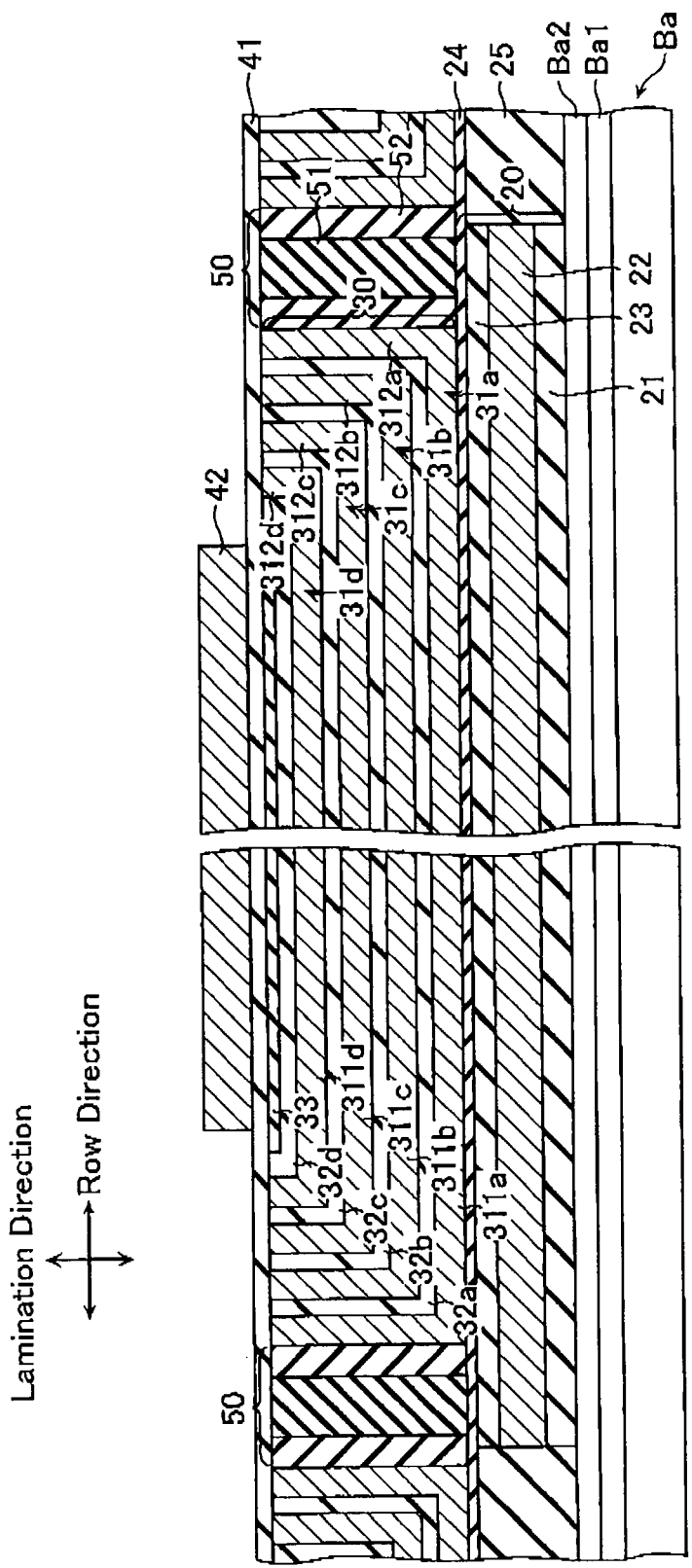
FIG. 13 is a cross-sectional view of the non-volatile semiconductor storage device 100 in the manufacturing process according to the first embodiment.

Then, silicon oxide ($SiO_2$) is deposited as illustrated in FIG. 13. Furthermore, polysilicon (p-Si) is deposited at positions matching the upper portion of the memory transistor layer 30. Through the above-mentioned process, a drain-side first insulation layer 41 and a drain-side conductive layer 42 are formed.

Figure 14:
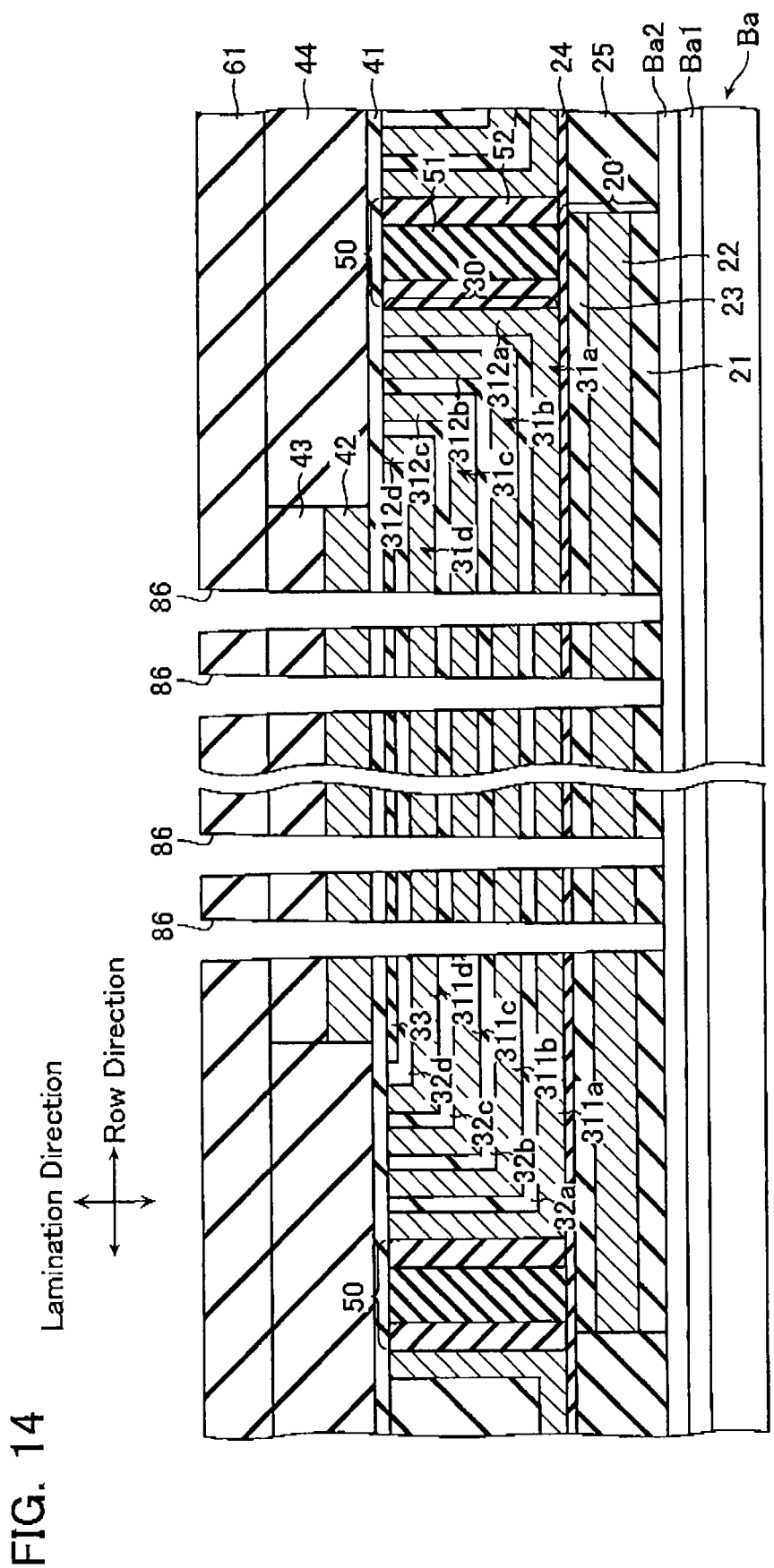
FIG. 14 is a cross-sectional view of the non-volatile semiconductor storage device 100 in the manufacturing process according to the first embodiment.

Then, as illustrated in FIG. 14, silicon oxide ($SiO_2$) is deposited to form a drain-side second insulation layer 43, an interlayer insulation layer 44, an interlayer insulation layer 61. Furthermore, holes 86 are formed to penetrate the interlayer insulation layer 61, the drain-side second insulation layer 43, the drain-side conductive layer 42, the drain-side first insulation layer 41, the memory transistor layer 30, and the source-side selection transistor layer 20. The holes 86 function as source-side holes 26, memory holes 34, drain-side holes 45, and first contact holes 71a.

Figure 15:
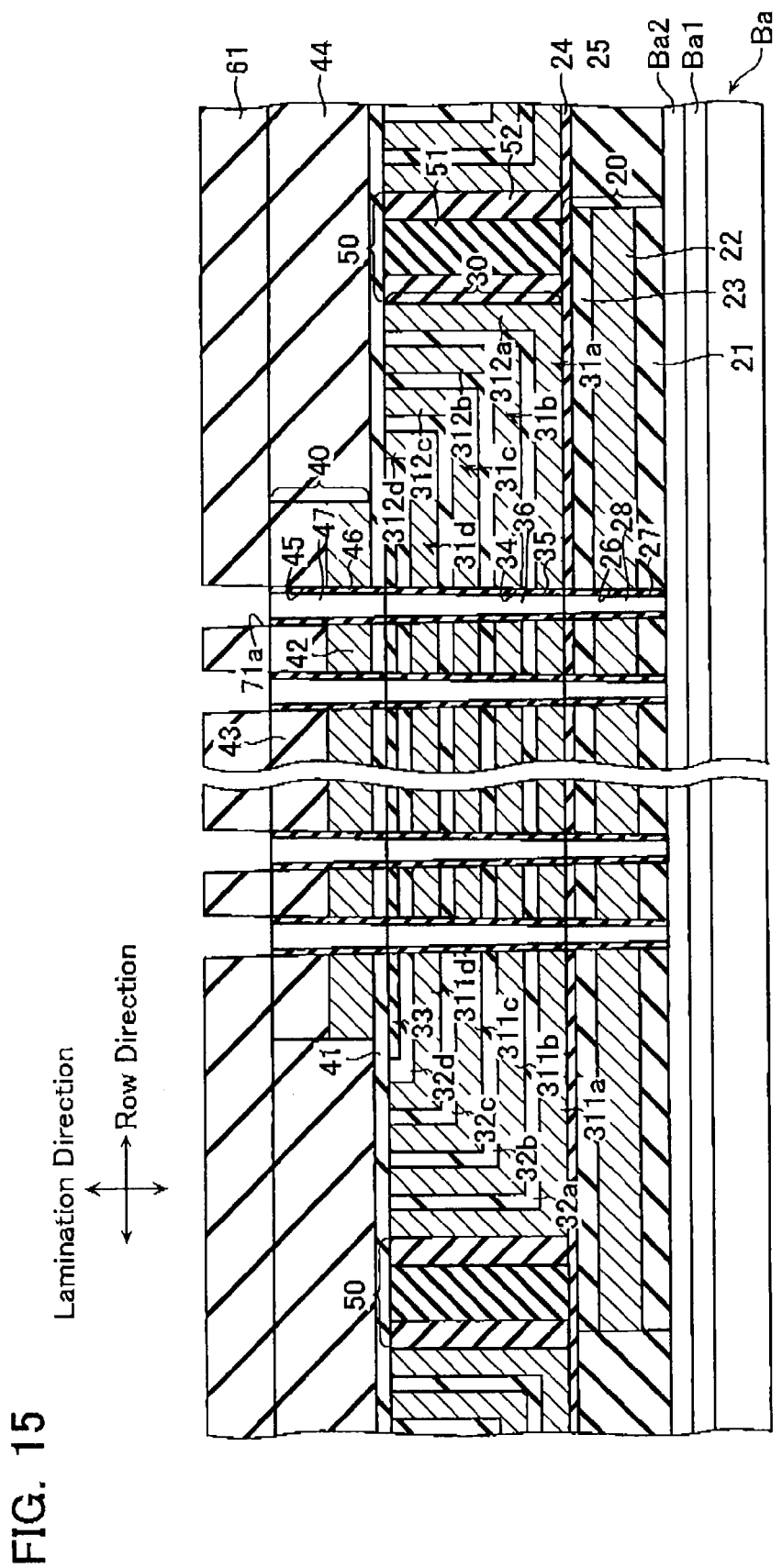
FIG. 15 is a cross-sectional view of the non-volatile semiconductor storage device 100 in the manufacturing process according to the first embodiment.

Then, as illustrated in FIG. 15, silicon oxide ($SiO_2$) and polysilicon (p-Si) are deposited on the sidewalls facing the source-side holes 26 to form source-side gate insulation layers 27 and source-side columnar semiconductor layers 28. In addition, silicon oxide ($SiO_2$), silicon nitride (SiN), silicon oxide ($SiO_2$), and polysilicon (p-Si) are deposited on the sidewalls facing the memory holes 34, thereby forming memory gate insulation layers 35 (tunnel insulation layers 35a, electric charge storage layers 35b, and block insulation layers 35c) and memory columnar semiconductor layers 36. Furthermore, silicon oxide ($SiO_2$) and polysilicon (p-Si) are deposited on the sidewalls facing the drain-side holes 45 to form drain-side gate insulation layers 46 and drain-side columnar semiconductor layers 47.

Following the step of FIG. 15, second to seventh contact holes 71b to 71g are formed, and titanium (Ti)/titanium nitride (TiN) and tungsten (W) are laminated to fill up the first to seventh contact holes 71a to 71q, thereby forming contact layers 72. Then, silicon oxide ($SiO_2$) is deposited to form an interlayer insulation layer 62. Furthermore, first to seventh trenches 75a to 75g are formed to penetrate the interlayer insulation layer 62, and titanium (Ti)/titanium nitride (TiN) and tungsten (W) are laminated to fill up the first to seventh trenches 75a to 75g, thereby forming wiring layers 76. Through this process, the non-volatile semiconductor storage device 100 of the first embodiment is formed as illustrated in FIG. 4.

Advantages of Non-Volatile Semiconductor Storage Device 100 in First Embodiment Advantages of the non-volatile semiconductor storage device 100 according to the first embodiment will now be described below. As can be seen from the above, in the non-volatile semiconductor storage device 100 of the first embodiment, the first to fourth word-line conductive layers 31a to 31d comprise: the first to fourth bottom portions 311a to 311d that extend in parallel to the semiconductor substrate Ba; and the first to fourth side portions 312a to 312d that extend upward along the protruding layers 50 in the orthogonal direction to the semiconductor substrate Ba, at the row-direction ends of the first to fourth bottom portions 311a to 311d. The top surfaces of the first to fourth side portions 312a to 312d are formed to align in the same plane. The first to fourth side portions 312a to 312d are formed with the first to fourth inter-wordline insulating layers 32a to 32d provided in the row direction. As such, there is no need to form the contact layers 72 with greater diameters than a predetermined diameter because they only need to be formed in contact with the top surfaces of the first to fourth side portions 312a to 312d on the same plane. The contact layers 72 are formed at intervals corresponding to the first to fourth inter-wordline insulating layers 32a to 32d. Therefore, the non-volatile semiconductor storage device 100 of the first embodiment may reduce its occupation area, as compared with the conventional examples where word-line conductive layers are formed in a stepwise manner in relation to each other at their ends.

In addition, according to the first embodiment, since each protruding layer 50 has a width in the row direction that is not more than its length in the lamination direction (i.e., the aspect ratio is not less than 1), those layers have a small volume that are laminated on the protruding layers 50 of the first embodiment (see FIG. 10) during the process of forming the memory transistor layer 30. The layers laminated on the protruding layers 50 are those ones that require polishing by CMP. Generally, mechanical polishing is performed in CMP. Accordingly, the protruding layers 50 are polished at a high polishing rate, while other flat or dimpled portions are polished at a relatively low polishing rate. As in the first embodiment of the present invention, if a high aspect ratio is provided and the protruding layers 50 have a small volume, then the layers laminated on the protruding layers 50 are removed at a high polishing rate. Therefore, the non-volatile semiconductor storage device according to the first embodiment allows for selective removal of such different types of laminated layers, i.e., the first to fourth conductive layers 31a to 31d and the first to fourth inter-wordline insulating layers 32a to 32d, so that they are flattened with relative ease.

Second Embodiment

Figure 16:
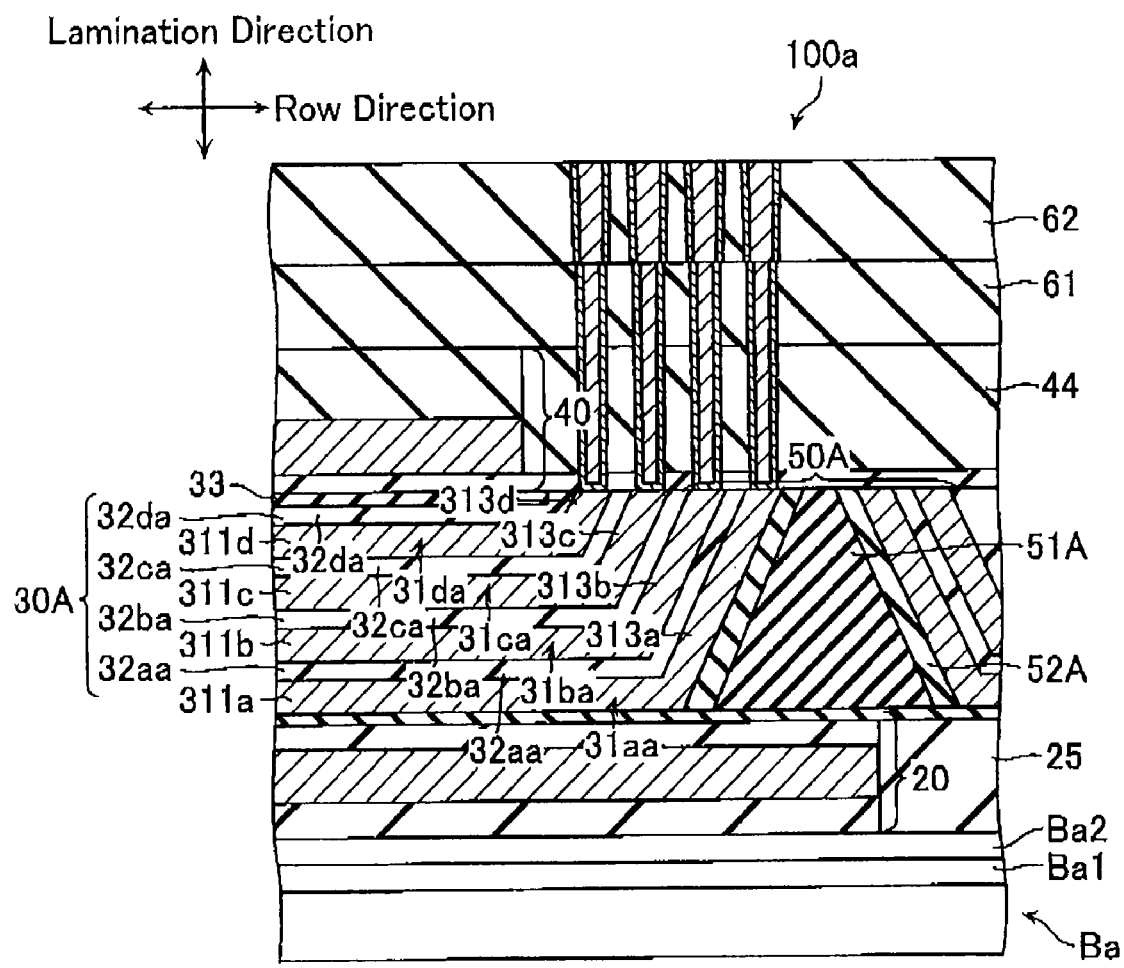
FIG. 16 is a cross-sectional view of a non-volatile semiconductor storage device 100a according to a second embodiment.

Specific Configuration of Non-Volatile Semiconductor Storage Device 100a in Second Embodiment Referring now to FIG. 16, a specific configuration of a non-volatile semiconductor storage device 100a according to a second embodiment will be described below. FIG. 16 is a cross-sectional view in the row direction of the non-volatile semiconductor storage device 100a of the second embodiment. Note that the same reference numerals represent the same components as the first embodiment and description thereof will be omitted in the second embodiment.

The non-volatile semiconductor storage device 100a of the second embodiment has a protruding layer 50A and a memory transistor layer 30A that are different from the first embodiment.

The protruding layer 50A is formed in a trapezoid shape. This means that the bottom surface of the protruding layer 50A is formed larger than the top surface of the protruding layer 50A. Each protruding layer 50A has a trapezoid columnar layer 51A and a sidewall layer 52A formed on the sidewalls of the trapezoid columnar layer 51A. The columnar layers 51A are composed of silicon oxide ($SiO_2$). The sidewall layers 52A are composed of silicon nitride (SiN).

The memory transistor layer 30A has first to fourth word-line conductive layers 31aa to 31da and first to fourth inter-wordline insulating layers 32aa to 32da that are different from the first embodiment. The first to fourth word-line conductive layers 31aa to 31da have the same first to fourth bottom portions 311a to 311d as the first embodiment. On the other hand, the first to fourth word-line conductive layers 31aa to 31da have first to fourth side portions 313a to 313d that are different from the first embodiment. The first to fourth side portions 313a to 313d are formed to extend upward at a predetermined inclination angle to the semiconductor substrate Ba along the protruding layer 50A, at the row-direction ends of the first to fourth bottom portions 311a to 311d. The first to fourth inter-wordline insulating layers 32aa to 32da are formed between the first to fourth word-line conductive layers 31aa to 31da of the above-mentioned shapes.

Advantages of Non-Volatile Semiconductor Storage Device 100a in Second Embodiment Advantages of the non-volatile semiconductor storage device 100a according to the second embodiment will now be described below. The non-volatile semiconductor storage device 100a of the second embodiment has substantially the same configuration as the first embodiment. Therefore, the non-volatile semiconductor storage device 100a of the second embodiment has the same advantages as described in the first embodiment.

Furthermore, unlike the first embodiment, the first to fourth word-line conductive layers 31aa to 31da have the first to fourth side portions 313a to 313d that are formed to extend upward at a predetermined inclination angle to the semiconductor substrate Ba along the protruding layer 50A, according to the non-volatile semiconductor storage device 100a of the second embodiment. Thus, the top surfaces of the first to fourth side portions 313a to 313d have larger areas as compared with the first embodiment. Therefore, the non-volatile semiconductor storage device 100a of the second embodiment allows the contact layers 72 to be more easily formed in contact with the first to fourth word-line conductive layers 31aa to 31da than the first embodiment.

Third Embodiment

Figure 17A:
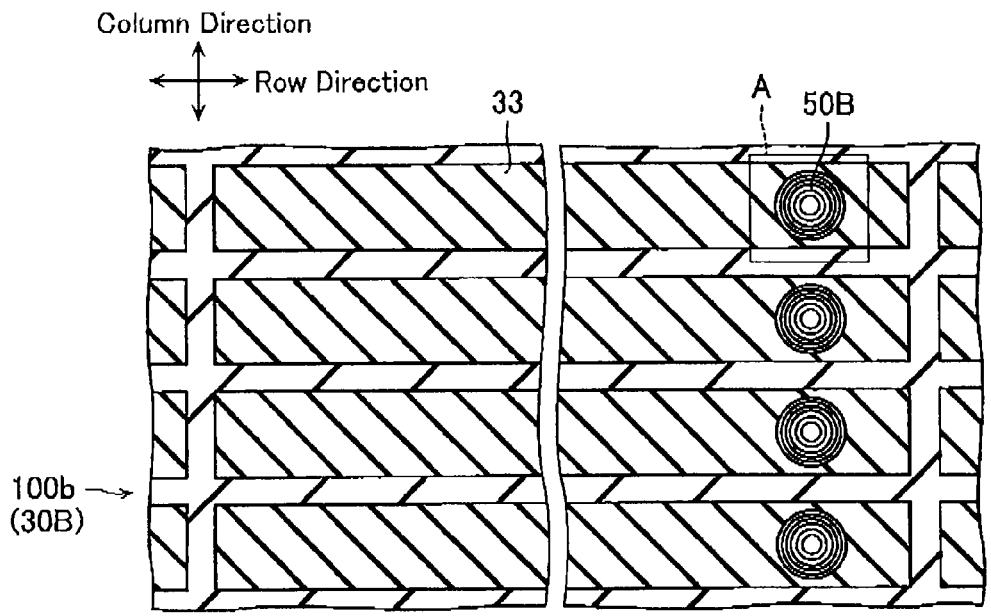
FIG. 17A is a schematic top plan view of a memory transistor layer 30B in a non-volatile semiconductor storage device 100b according to a third embodiment.
Figure 17B:
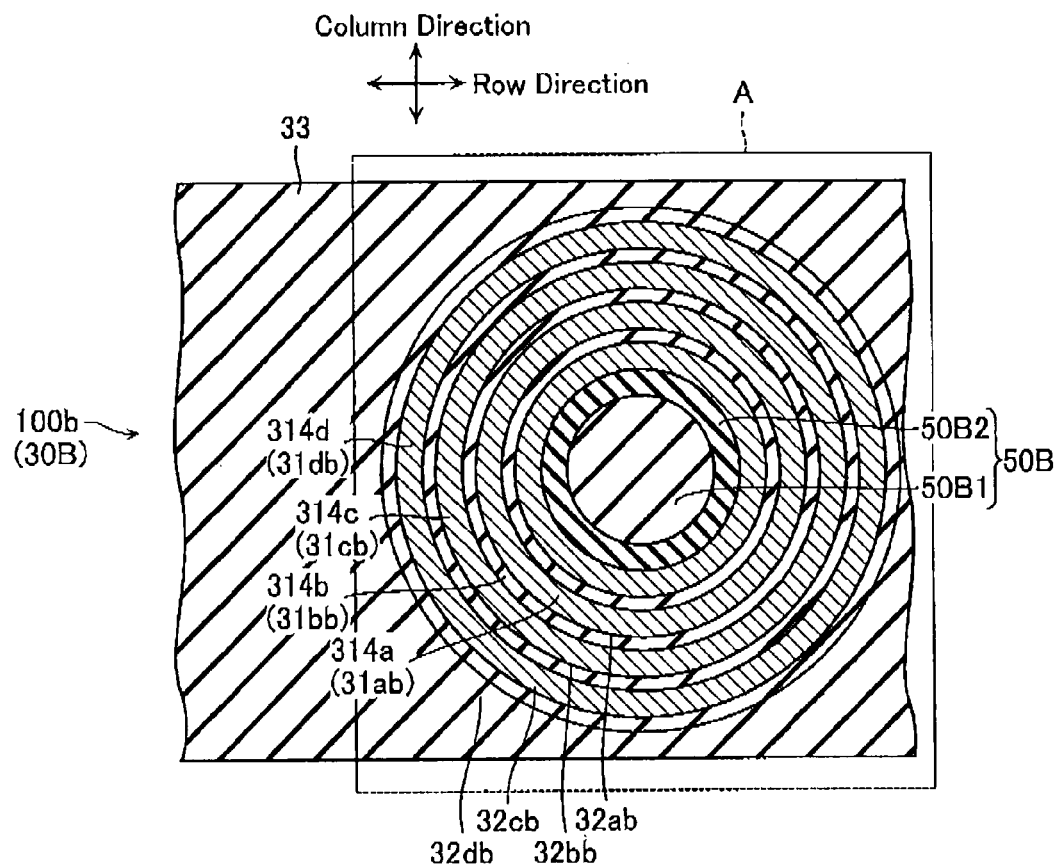
FIG. 17B is an enlarged view of FIG. 17A.
Figure 17C:
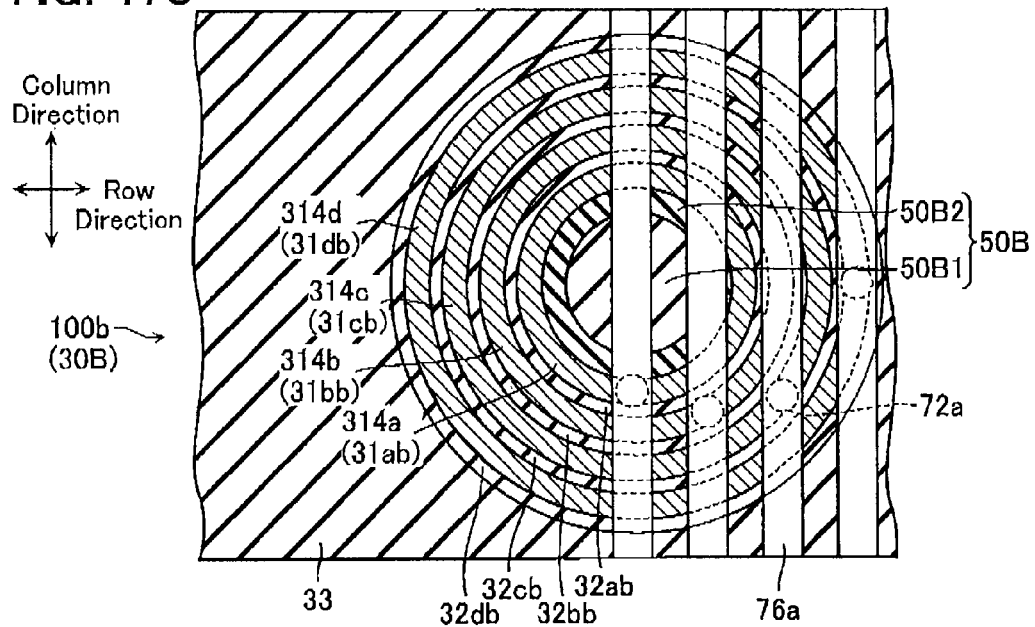
Figure 17D:
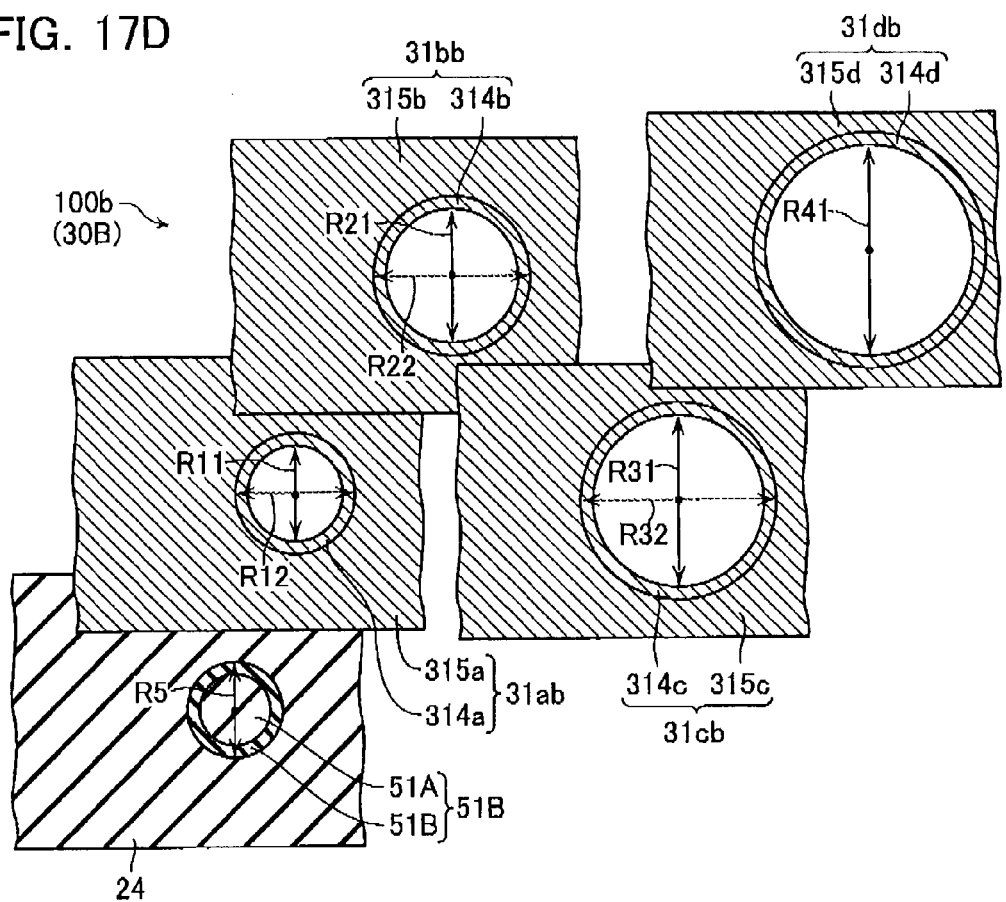
FIG. 17D is a schematic top plan view illustrating first to fourth word-line conductive layers 31ab to 31db.

Specific Configuration of Non-Volatile Semiconductor Storage Device 100b in Third Embodiment Referring now to FIGS. 17A to 17D, a configuration of a non-volatile semiconductor storage device 100b according to a third embodiment will be described below. FIG. 17A is a schematic top plan view of a memory transistor layer 30B in the non-volatile semiconductor storage device 100b of the third embodiment. FIG. 17B is an enlarged view of A part of FIG. 17A. FIG. 17C is a schematic top plan view illustrating the memory transistor layer 30B, contact layers 72a, and wiring layers 76a. FIG. 17D is a schematic top plan view illustrating first to fourth word-line conductive layers 31ab to 31db. Note that the same reference numerals represent the same components as the first and second embodiments and description thereof will be omitted in the third embodiment.

As illustrated in FIGS. 17A to 17D, the non-volatile semiconductor storage device 100b of the third embodiment has a memory transistor layer 30B and protruding layers 50B that are different from the first and second embodiments.

The memory transistor layer 303 has first to fourth word-line conductive layers 31ab to 31db and first to fourth inter-wordline insulating layers 32ab to 32db that are different from the first and second embodiments.

Each protruding layer 50B is formed in a round columnar shape with a radius R5. Each protruding layer 50B has a diameter (twice the radius R5) that is not more than its height in the lamination direction. That is, as in the first embodiment, each protruding layer 50B has a width in the row direction that is not more than its length in the lamination direction.

Each protruding layer 508 has a columnar layer 51B in round columnar shape and a sidewall layer 52B formed on the sidewall of the columnar layer 51B. The columnar layers 51B are composed of silicon oxide ($SiO_2$). The sidewall layers 52B are composed of silicon nitride (SiN). The protruding layers 50B are formed in a matrix form in the row and column directions. The protruding layers 50B are formed in such a way that they are surrounded by the first to fourth word-line conductive layers 31ab to 31db.

The first to fourth word-line conductive layers 31ab to 31db are formed to surround the protruding layers 50B. Each of the first to fourth word-line conductive layers 31ab to 31db is formed in a hat shape with its aperture placed on the top surface. The first to fourth word-line conductive layers 31ab to 31db have first to fourth cylindrical portions (first to fourth side portions) 314a to 314d and first to fourth brim portions (first to fourth bottom portions) 315a to 315d.

Each of the first to fourth cylindrical portions 314a to 314d is formed in a round cylindrical shape. The first to fourth cylindrical portions 314a to 319d are formed to extend upward from the respective ends of the first to fourth brim portions 315a to 315d along the protruding layers 50B, in the orthogonal direction to the semiconductor substrate Ba. The first to fourth cylindrical portions 314a to 314d are formed in such a way that their central axes coincide with the respective centers of the protruding layers 50B. The first cylindrical portion 314a is formed with an inner diameter R11 that is greater than the radius R5 of the protruding layer 50B. The second cylindrical portion 314b is formed with an inner diameter R21 that is greater than an outer diameter R12 of the first cylindrical portion 319a. The third cylindrical portion 314c is formed with an inner diameter R31 that is greater than an outer diameter R22 of the second cylindrical portion 314b. The fourth cylindrical portion 314d is formed with an inner diameter R41 that is greater than an outer diameter R32 of the third cylindrical portion 314c. The top surfaces of the first to fourth cylindrical portions 314a to 314d are formed in donut shapes as viewed from above. The top surfaces of the first to fourth cylindrical portions 314a to 314d are formed to align in the same plane.

The first to fourth brim portions 315a to 315d are formed in brim shapes. The first to fourth brim portions 315a to 315d are formed to extend in parallel to the semiconductor substrate Ba. The first to fourth brim portions 315a to 315d are formed in generally rectangular plate shapes taking the row direction as the longitudinal direction, as viewed from above. In addition, the first to fourth brim portions 315a to 315d have their respective ends located at positions in contact with the first to fourth cylindrical portions 314a to 314d.

The first to fourth inter-wordline insulating layers 32ab to 32db are provided between the first to fourth word-line conductive layers 31ab to 31db, respectively.

In addition, the non-volatile semiconductor storage device 100b has contact layers 72a and wiring layers 76a that are different from the first and second embodiments. The contact layers 72a are formed in contact with the top surfaces of the first to fourth cylindrical portions 314a to 314d of the first to fourth word-line conductive layers 31ab to 31db that are formed in circular shapes (donut shapes) as viewed from above. The wiring layers 76a are formed to extend in the column direction so as to come in contact with the respective contact layers 72a.

Manufacturing Process of Non-Volatile Semiconductor Storage Device 100b in Third Embodiment Referring now to FIGS. 18 to 20, the manufacturing process of the non-volatile semiconductor storage device 100b according to the third embodiment will be described below. Here, FIGS. 18 to 20 are top plan views illustrating the manufacturing process of the non-volatile semiconductor storage device 100b of the third embodiment.

Firstly, for the non-volatile semiconductor storage device 100b of the third embodiment, the same step is executed as illustrated in FIG. 8 in the first embodiment.

Figure 18:
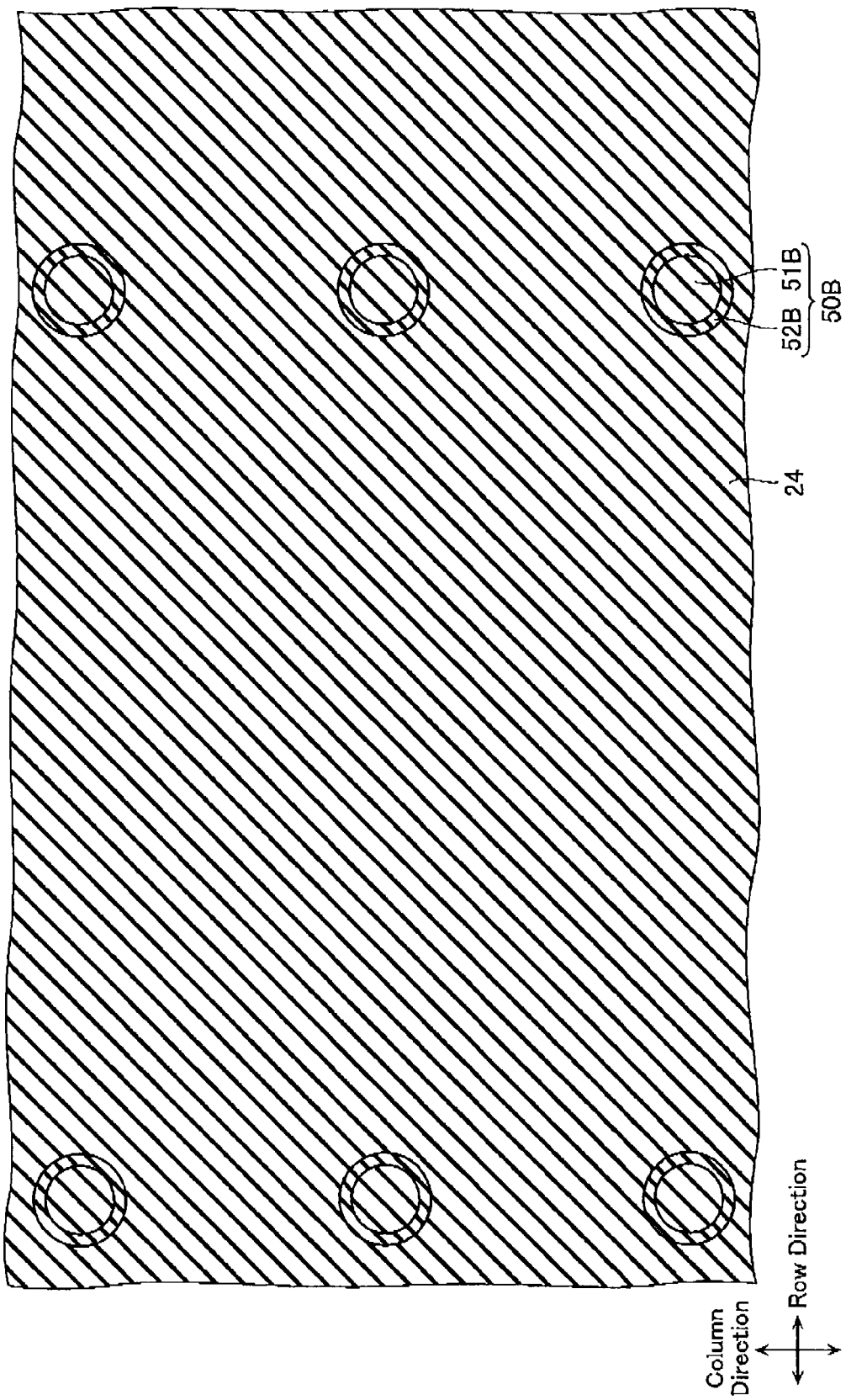
FIG. 18 is a top plan view of the non-volatile semiconductor storage device 100b in a manufacturing process according to the third embodiment.

Then, as illustrated in FIG. 18, the silicon oxide layer 81 is etched so that only a predetermined width of the silicon oxide layer 81 will be left at a predetermined interval in the row and column directions (in a matrix form) while providing a round columnar shape. Furthermore, silicon nitride (SiN) is formed on the side surfaces of the etched silicon oxide layers 81. Through this process, protruding layers 50B are formed. That is, the etched silicon oxide layers 81 provide the columnar layers 51B in round columnar shape. In addition, the silicon nitride formed on the side surfaces of the silicon oxide layers 81 provides sidewall layers 52B.

Figure 19:
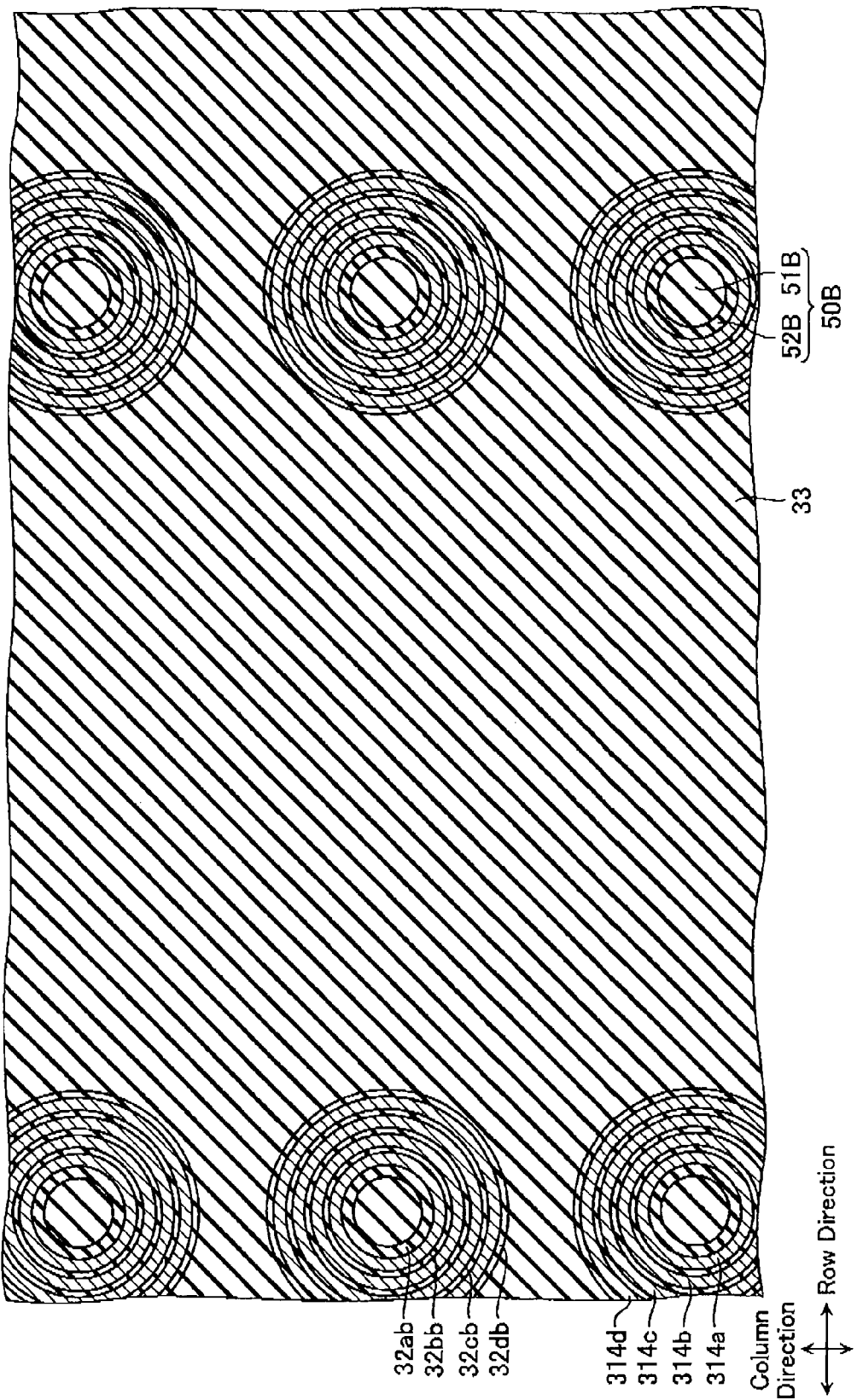
FIG. 19 is a top plan view of the non-volatile semiconductor storage device 100b in the manufacturing process according to the third embodiment.
Figure 20:
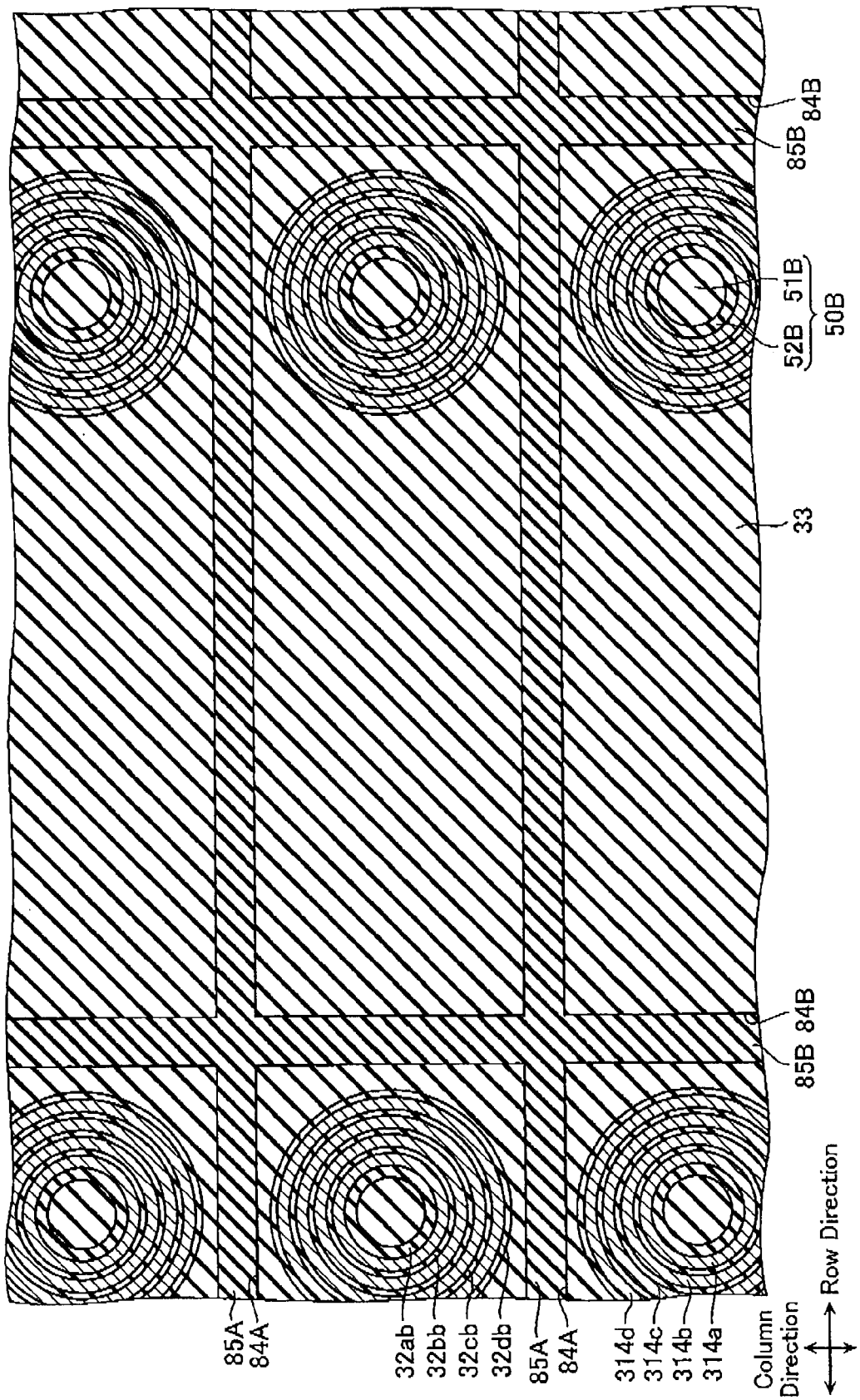
FIG. 20 is a top plan view of the non-volatile semiconductor storage device 100b in the manufacturing process according to the third embodiment.

Then, after the step as illustrated in FIG. 10 in the first embodiment, first to fourth word-line conductive layers 31ab to 31db, first to fourth inter-wordline insulating layers 32ab to 32db, and memory isolation/insulation layer 33 are formed to surround the protruding layers 50B, as illustrated in FIG. 19.

Subsequently, as illustrated in FIG. 20, first through trenches 84A are formed to extend in the row direction between the protruding layers 50B. Second through trenches 84B are also formed to extend in the column direction between the protruding layers 50B. The first through trenches 84A and the second through trenches 84B are formed to penetrate the memory isolation/insulation layer 33, the first to fourth word-line conductive layers 31ab to 31db, the first to fourth inter-wordline insulating layers 32ab to 32db, and the source-side selection transistor layer 20. Furthermore, silicon oxide ($SiO_2$) is deposited to fill up the first through trenches 84A and the second through trenches 84B to form interlayer insulation layers 85A and 85B. The step of FIG. 19 is followed by those steps as illustrated in FIGS. 13 to 15 in the first embodiment, thereby forming the non-volatile semiconductor storage device 100b of the third embodiment as illustrated in FIGS. 17A to 17D.

Through the above-mentioned manufacturing process, the protruding layers 50B are included in the closed curve formed by the first and second through holes 84A and 84B. That is, the protruding layers 50B do not intersect the first and second through holes 84A and 84B.

Advantages of Non-Volatile Semiconductor Storage Device 100b in Third Embodiment Advantages of the non-volatile semiconductor storage device 100b according to the third embodiment will now be described below. The non-volatile semiconductor storage device 100b of the third embodiment has substantially the same configuration as the first embodiment. Therefore, the non-volatile semiconductor storage device 100b of the third embodiment has the same advantages as described in the first embodiment.

Furthermore, the non-volatile semiconductor storage device 100b of the third embodiment has the protruding layers 50B in round columnar shape and the first to fourth word-line conductive layers 31ab to 31db formed to surround the protruding layers 50B that are different from the first embodiment. For the purpose of explaining the advantages of the third embodiment, consider the following comparison with the first embodiment mentioned above. In the manufacturing process of the non-volatile semiconductor storage device 100 of the first embodiment, as illustrated in FIG. 12, the protruding layers 50 are cut off when the through trenches 84 are formed. According to the first embodiment, the through trenches 84 are formed across the uneven layers including the protruding layers 50. This means that when the through trenches 84 are etched, the first to fourth word-line conductive layers 31a to 31d and the first to fourth inter-wordline insulating layers 32a to 32d alternately appear in time, at the bottom portions providing the through trenches 84. On the contrary, in the protruding layers 50, the first to fourth word-line conductive layers 31a to 31d and the first to fourth inter-wordline insulating layers 32a to 32d continue to be etched at the same time. Due to this relation, according to the first embodiment, the formation of the bottom portions of the through trenches with a uniform depth requires a sophisticated combination of the RIE technologies.

On the other hand, according to the third embodiment, as described in the manufacturing process of FIG. 20, the protruding layers 50B cannot be cut off when the first through trenches 84A and the second through trenches 84B are formed. This means that according to the third embodiment, the first through trenches 84A and the second through trenches 84B are formed across more even layers than the first embodiment. That is, at the time of etching, the first to fourth word-line conductive layers 31ab to 31db and the first to fourth inter-wordline insulating layers 32ab to 32db alternately appear in time. Therefore, as the RIE technology, alternately repeating selective etching steps of the first to fourth word-line conductive layers 31ab to 31db and the first to fourth inter-wordline insulating layers 32ab to 32db allows the first and second through trenches 84A and 84B with a uniform depth to be easily formed. That is, the non-volatile semiconductor storage device 100b of the third embodiment may be manufactured more easily than the first embodiment.

Fourth Embodiment

Figure 21:
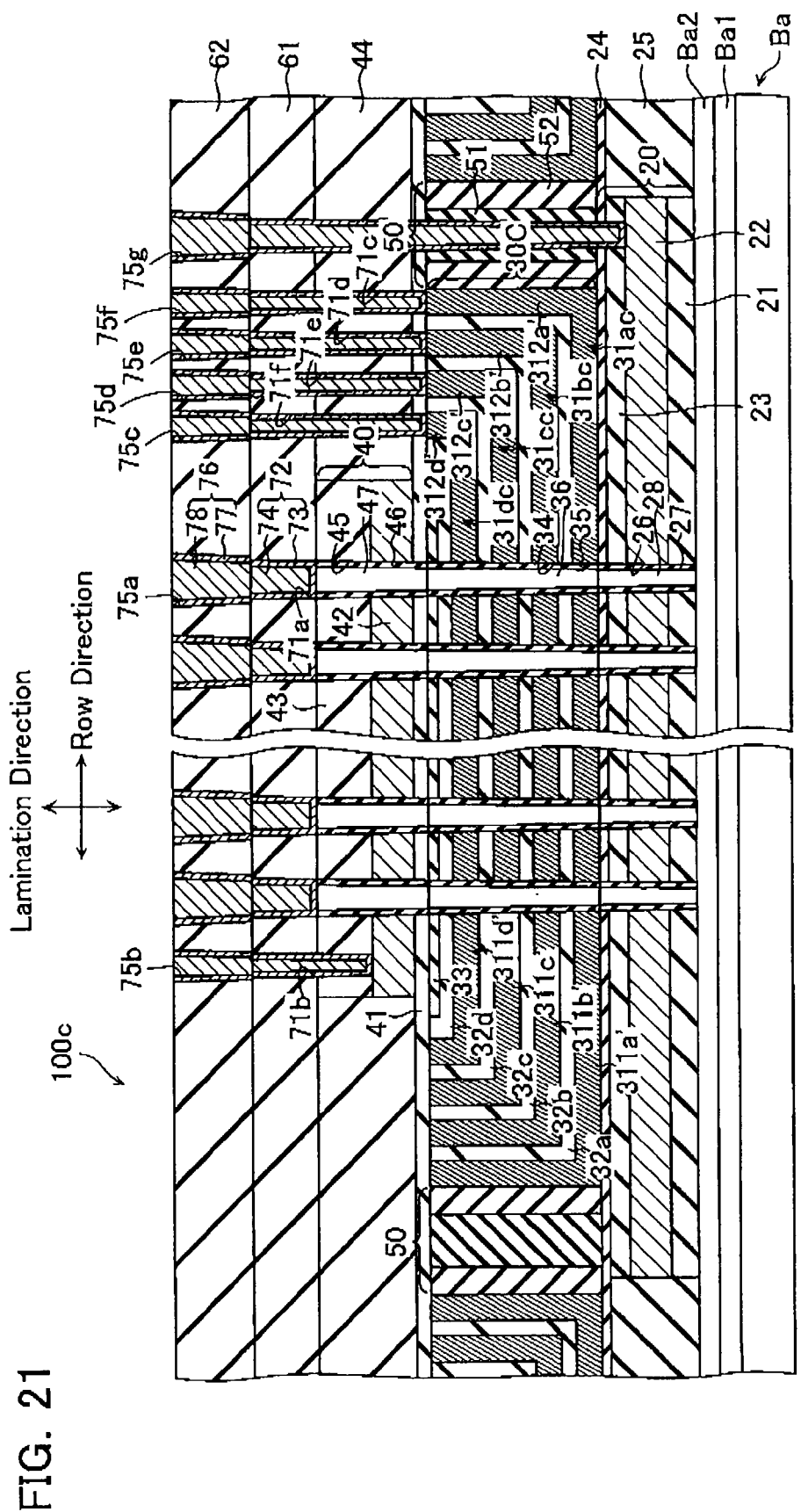
FIG. 21 is a cross-sectional view of a non-volatile semiconductor storage device 100c according to a fourth embodiment.

Specific Configuration of Non-Volatile Semiconductor Storage Device 100c in Fourth Embodiment Referring now to FIG. 21, a specific configuration of a non-volatile semiconductor storage device 100c according to a fourth embodiment will be described below. FIG. 21 is a cross-sectional view in the row direction of the non-volatile semiconductor storage device 100c of the fourth embodiment. Note that the same reference numerals represent the same components as the first to third embodiments and description thereof will be omitted in the fourth embodiment.

As illustrated in FIG. 21, the non-volatile semiconductor storage device 100c of the fourth embodiment has a memory transistor layer 30C different from the first to third embodiments.

The memory transistor layer 30C has first to fourth word-line conductive layers 31ac to 31dc different from the first to third embodiments. The first to fourth word-line conductive layers 31ac to 31dc are configured to contain metal (e.g., aluminum (Al)). Note that the first to fourth word-line conductive layers 31ac to 31dc have first to fourth bottom portions 311a' to 311d' and first to fourth side portions 312a' to 312d' in similar shapes to those in the first embodiment.

Manufacturing Process of Non-Volatile Semiconductor Storage Device 100c in Fourth Embodiment Referring now to FIGS. 22 to 24, the manufacturing process of the non-volatile semiconductor storage device 100c according to the fourth embodiment will be described below.

Firstly, the steps of FIGS. 8 to 15 in the first embodiment are executed. Then, silicon oxide (SiO$_2$) is deposited to fill up the first contact holes 71a located above the drain-side holes 45. Through this process, the interlayer insulation layer 61 is also formed on the drain-side columnar semiconductor layers 47.

Figure 22:
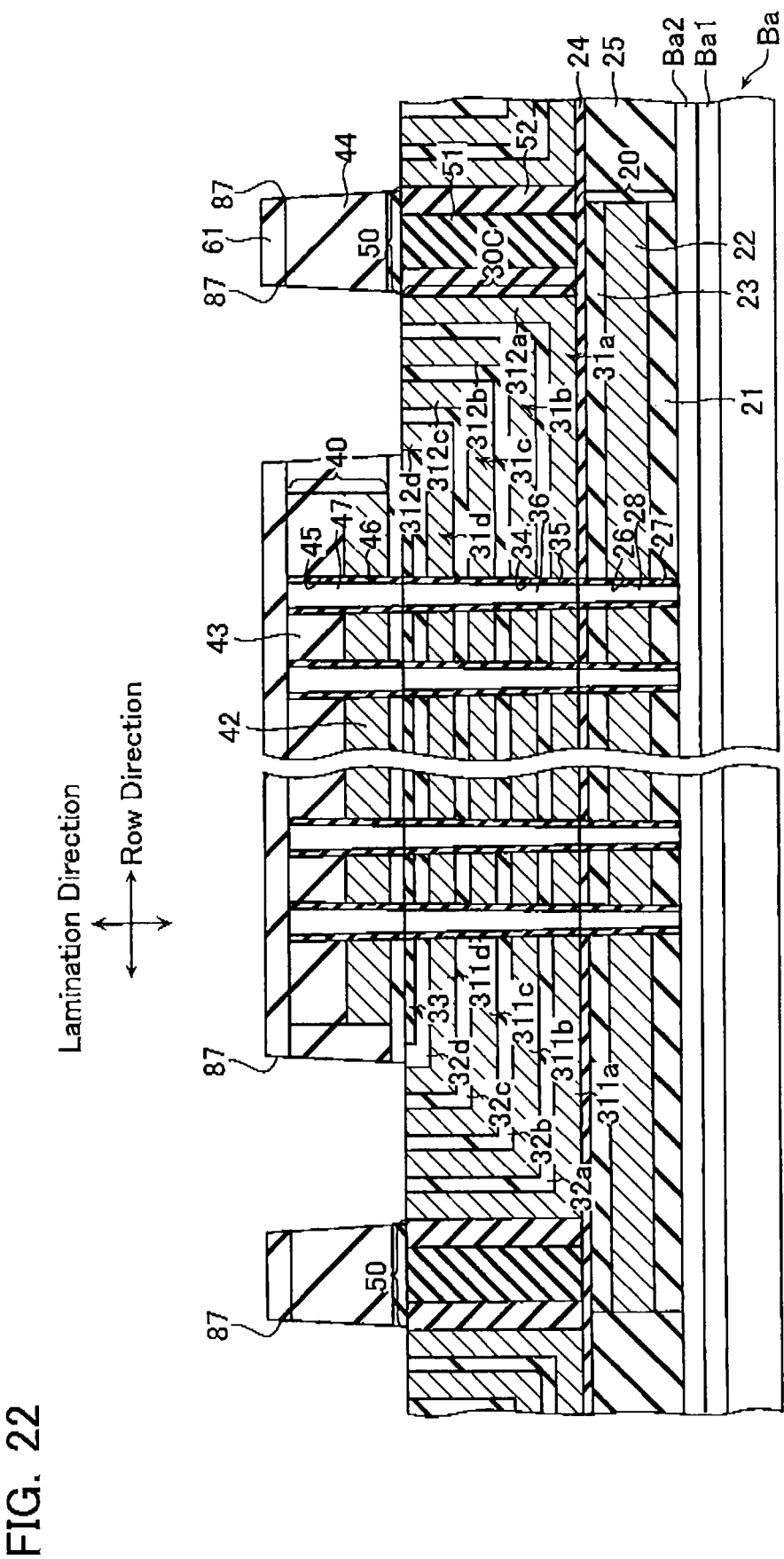
FIG. 22 is a cross-sectional view of the non-volatile semiconductor storage device 100c in a manufacturing process according to the fourth embodiment.
Figure 23:
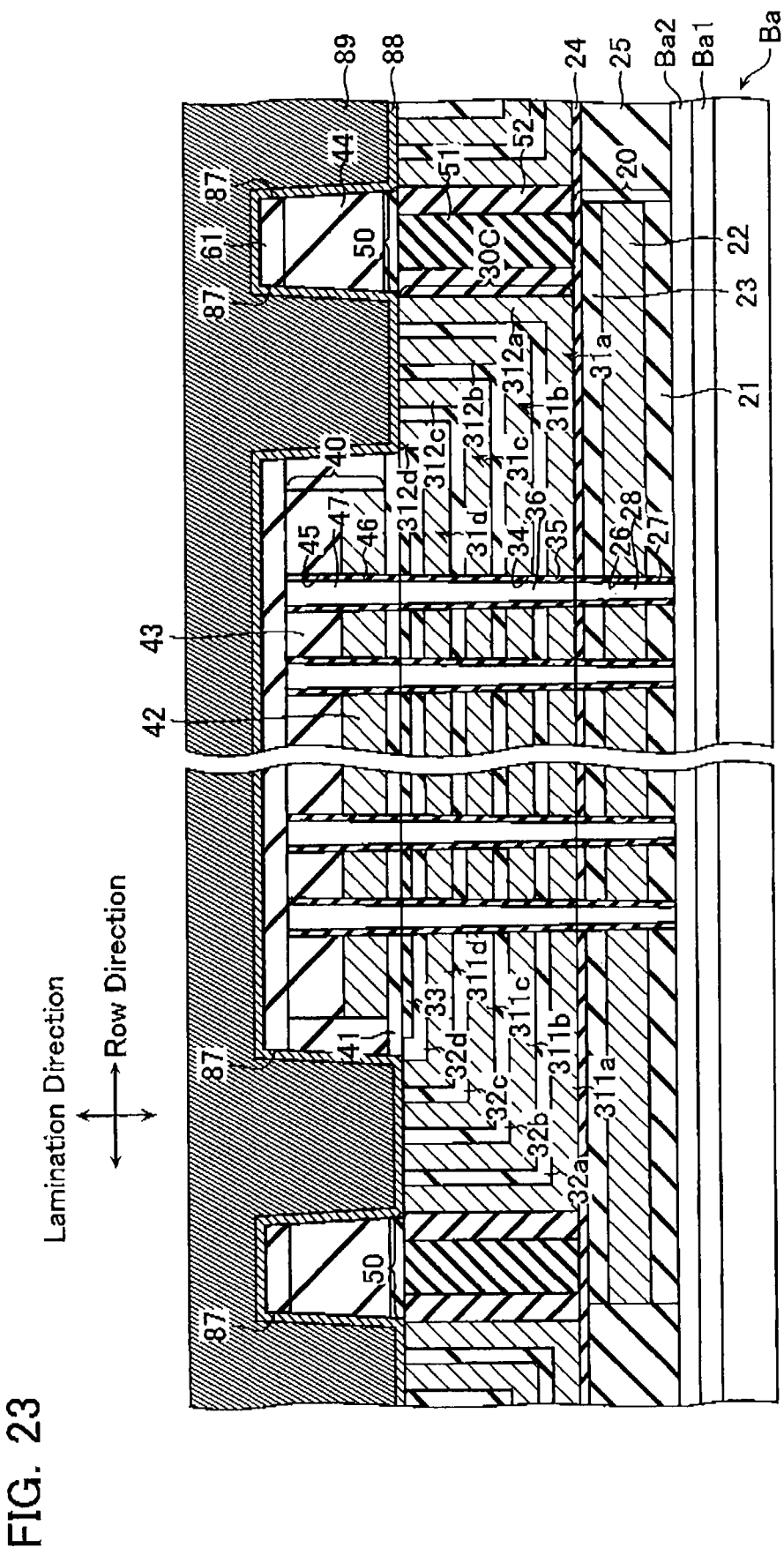
FIG. 23 is a cross-sectional view of the non-volatile semiconductor storage device 100c in the manufacturing process according to the fourth embodiment.

Then, as illustrated in FIG. 22, trenches 87 are formed so that the top surfaces of the side portions 312a to 312d of the first to fourth word-line conductive layers 31a to 31d are exposed. Then, as illustrated in FIG. 23, a titanium (Ti) layer 88 of on the order of 5 nm and an aluminum (Al) layer 89 are deposited within the trenches 87.

Figure 24:
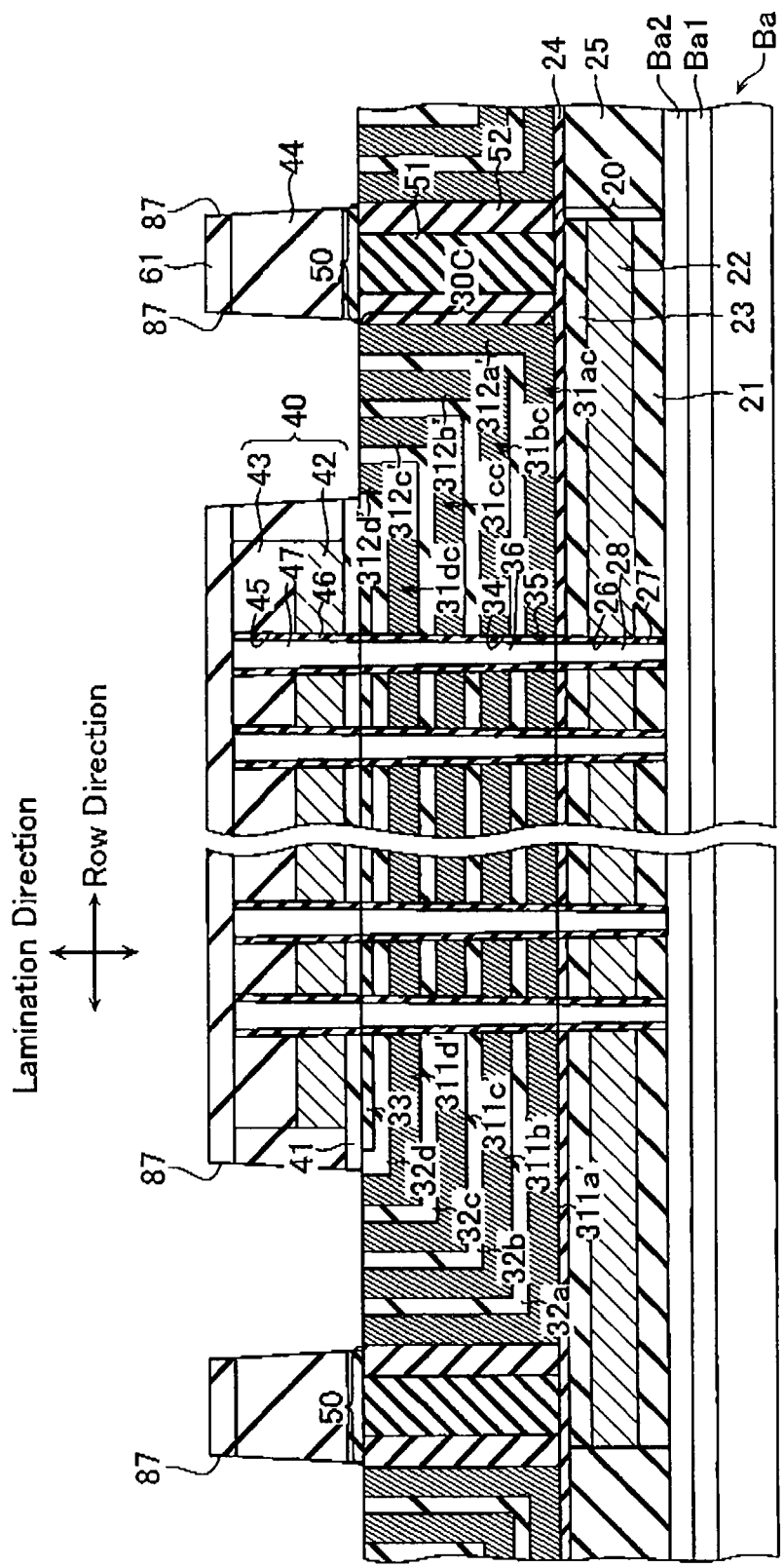
FIG. 24 is a cross-sectional view of the non-volatile semiconductor storage device 100c in the manufacturing process according to the fourth embodiment.

Subsequently, as illustrated in FIG. 24, heat treatment is performed so that a large amount of aluminum from the aluminum layer 89 is caused to be contained by the first to fourth word-line conductive layers 31a to 31d that are composed of polysilicon. Through this process, first to fourth word-line conductive layers 31ac to 31ad containing metal are formed according to the fourth embodiment. After the step of FIG. 23, the trenches 87 are filled with silicon oxide (SiO$_2$), and then the subsequent steps are executed as illustrated in the first embodiment, by which the non-volatile semiconductor storage device 100c of the fourth embodiment is formed as illustrated in FIG. 21.

Advantages of Non-Volatile Semiconductor Storage 100c Device in Fourth Embodiment Advantages of the non-volatile semiconductor storage device 100c according to the fourth embodiment will now be described below. The non-volatile semiconductor storage device 100c of the fourth embodiment has substantially the same configuration as the first embodiment. Therefore, the non-volatile semiconductor storage device 100c of the fourth embodiment has the same advantages as described in the first embodiment.

Furthermore, in the non-volatile semiconductor storage device 100c of the fourth embodiment, the first to fourth word-line conductive layers 31ac to 31dc are configured to contain metal (e.g., aluminum (Al)). Thus, the first to fourth word-line conductive layers 31ac to 31dc in the non-volatile semiconductor storage device 100c of the fourth embodiment may have a lower resistance than in the first embodiment.

In addition, as in the first embodiment, the first to fourth word-line conductive layers 31ac to 31dc have the first to fourth side portions 312a' to 312d'. Accordingly, as described in the step of FIG. 22, the non-volatile semiconductor storage device 100c of the fourth embodiment allows the aluminum layer 89 to come in contact with the first to fourth word-line conductive layers 31ac to 31dc, at the top surfaces of the first to fourth side portions 312a' to 312d'.

Fifth Embodiment

Figure 25:
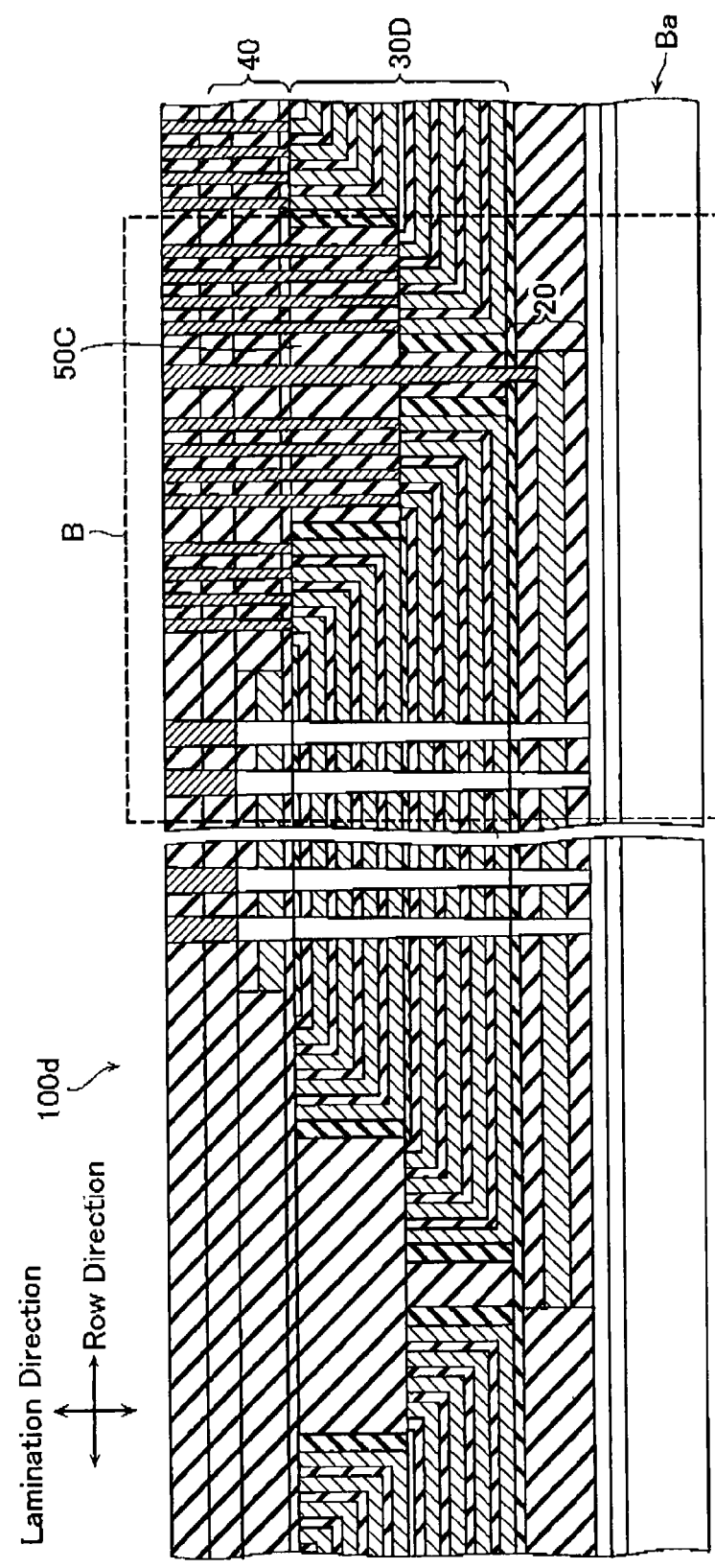
FIG. 25 is a cross-sectional view of a non-volatile semiconductor storage device 100d according to a fifth embodiment.
Figure 26:
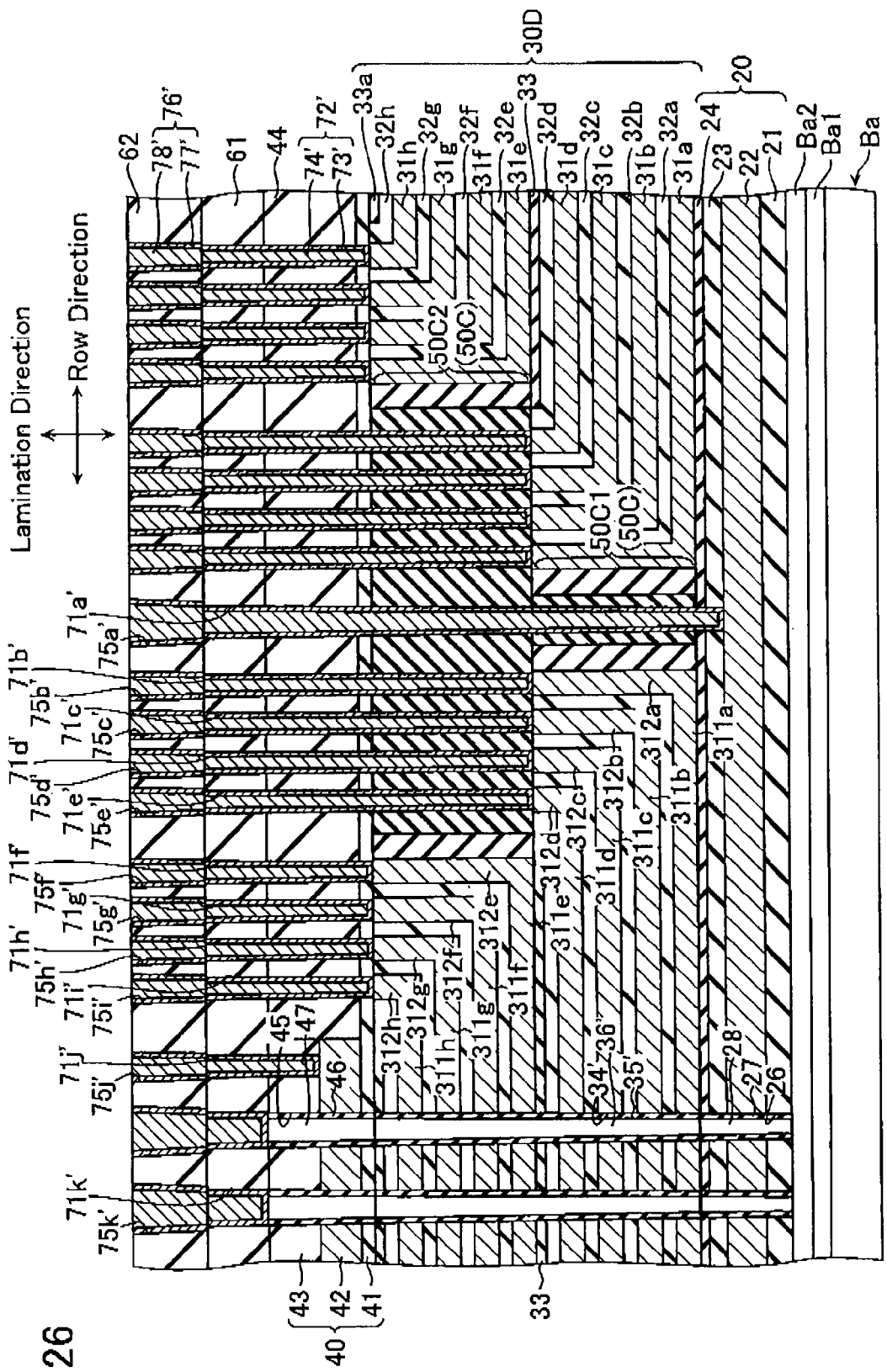
FIG. 26 is an enlarged view of B part of FIG. 25.

Specific Configuration of Non-Volatile Semiconductor Storage Device 100d in Fifth Embodiment Referring now to FIGS. 25 and 26, a specific configuration of a non-volatile semiconductor storage device 100d according to a fifth embodiment will be described below. FIG. 25 is a cross-sectional view in the row direction of the non-volatile semiconductor storage device 100d of the fifth embodiment. FIG. 26 is an enlarged view of B part of FIG. 25. Note that the same reference numerals represent the same components as the first to fourth embodiments and description thereof will be omitted in the fifth embodiment.

As illustrated in FIG. 25, the non-volatile semiconductor storage device 100d of the fifth embodiment has protruding layers 50C and a memory transistor layer 30D that are different from the first to fourth embodiments.

The protruding layers 50C are formed in a stepwise manner in relation to each other so that a higher layer has a larger width in the row direction than a lower one. As illustrated in FIG. 26, each protruding layer 50C includes a first protruding layer 50C1 and a second protruding layer 50C2. The first protruding layer 50C1 has the same configuration as the protruding layer 50 of the first embodiment. The second protruding layer 50C2 is formed on the first protruding layer 50C1. The second protruding layer 50C2 is formed with a width in the row direction that is greater than a width of the first protruding layer 50C1 in the row direction.

As in the first embodiment, the memory transistor layer 30D has a structure where the first to fourth word-line conductive layers 31a to 31d, the first to fourth inter-wordline insulating layers 32a to 32d, and the memory isolation/insulation layer 33 are laminated on the top surface of the source-side selection transistor layer 20. Furthermore, the memory transistor layer 30D has a structure where fifth to eighth word-line conductive layers 31e to 31h, fifth to eighth inter-wordline insulating layers 32e to 32h, and a memory isolation/insulation layer 33a are alternately laminated on the isolation/insulation layer 33.

The first to fourth word-line conductive layers 31a to 31d, the first to fourth inter-wordline insulating layers 32a to 32d, and the memory isolation/insulation layer 33 have the same configuration as the first embodiment. That is, for example, the first to fourth side portions 312a to 312d of the first to fourth word-line conductive layers 31a to 31d are formed to extend upward along the first protruding layers 50C1 in an orthogonal direction to the semiconductor substrate Ba.

The fifth to eighth word-line conductive layers 31e to 31h are formed in "U-shapes" (concave shapes) with upward apertures in the cross-section as illustrated in FIG. 24. The fifth to eighth word-line conductive layers 31e to 31h have fifth to eighth bottom portions 311e to 311h and fifth to eighth side portions 312e to 312h.

The fifth to eighth bottom portions 311e to 311h are formed to extend in parallel to the semiconductor substrate Ba. The fifth bottom portion 311e has a width in the row direction that is less than a width of the fourth bottom portion 311d in the row direction. The sixth bottom portion 311f has a width in the row direction that is less than a width of the fifth bottom portion 311e in the row direction. The seventh bottom portion 311g has a width in the row direction that is less than a width of the sixth bottom portion 311f in the row direction. The eighth bottom portion 311h has a width in the row direction that is less than a width of the seventh bottom portion 311g in the row direction.

The fifth to eighth side portions 312e to 312h are formed to extend upward along the second protruding layers 50C2 in an orthogonal direction to the semiconductor substrate Ba, at the row direction ends of the fifth to eighth bottom portions 311e to 311h. The top surfaces of the fifth to eighth side portions 312e to 312h are formed to align at a predetermined height.

In addition, the memory transistor layer 30D has memory holes 34', memory gate insulation layers 35', and memory columnar semiconductor layers 36' that are different from the first to fourth embodiments. The memory holes 34' are formed to penetrate the memory isolation/insulation layer 33a, the memory isolation/insulation layer 33, the first to eighth word-line conductive layers 31a to 31h, and the first to eighth inter-wordline insulating layers 32a to 32h. The memory gate insulation layers 35' are formed on the sidewalls facing the memory holes 34'. The memory columnar semiconductor layers 36' are formed to fill up the memory holes 34' while contacting the memory gate insulation layers 35'.

In addition, the non-volatile semiconductor storage device 100d has first to eleventh contact holes 71a' to 71k' different from the first to fourth embodiments.

Each first contact hole 71a' is formed to reach the top surface of the source-side conductive layer 22. The first contact hole 71a' is formed to penetrate the interlayer insulation layer 61, the interlayer insulation layer 44, the drain-side first insulation layer 41, the second protruding layers 50C2, the first protruding layers 50C1, the source-side isolation/insulation layer 24, and the source-side second insulation layer 23.

Second to fifth contact holes 71b' to 71e' are formed to reach the top surfaces of the first to fourth side portions 312a to 312d of the first to fourth word-line conductive layers 31a to 31d. The second to fifth contact holes 71b' to 71e' are formed to penetrate the interlayer insulation layer 61, the interlayer insulation layer 44, the drain-side first insulation layer 41, and the second protruding layers 50C2.

Sixth to ninth contact holes 71f' to 71i' are formed to reach the top surfaces of the fifth to eighth side portions 312e to 312h of the fifth to eighth word-line conductive layers 31e to 31h. The sixth to ninth contact holes 71f' to 71i' are formed to penetrate the interlayer insulation layer 61, the interlayer insulation layer 44, and the drain-side first insulation layer 41.

Each tenth contact hole 71j' is formed to reach the top surface of the drain-side conductive layer 42. The tenth contact hole 71j' is formed to penetrate the interlayer insulation layer 61 and the drain-side second insulation layer 43.

Each eleventh contact hole 71k' is formed to reach the top surface of a drain-side columnar semiconductor layer 47. The eleventh contact hole 71k' is formed to penetrate the interlayer insulation layer 61.

The first to eleventh contact holes 71a' to 71k' have contact layers 72' formed therein. Each contact layer 72' has a barrier metal layer 73' and a metal layer 74'. The barrier metal layers 73' are composed of titanium (Ti)/titanium nitride (TiN). The metal layers 74' are composed of tungsten (W).

In addition, the non-volatile semiconductor storage device 100d has first to eleventh trenches 75a' to 75k' that are provided at positions matching the first to eleventh contact holes 71a' to 71k' and formed to penetrate the interlayer insulation layer 62. The first to eleventh trenches 75a' to 75k' have wiring layers 76' formed therein.

Each wiring layer 76' has a barrier metal layer 77' and a metal layer 78'. The barrier metal layers 77' are composed of titanium (Ti)/titanium nitride (TiN). The metal layers 78' are composed of tungsten (W).

Figure 27:
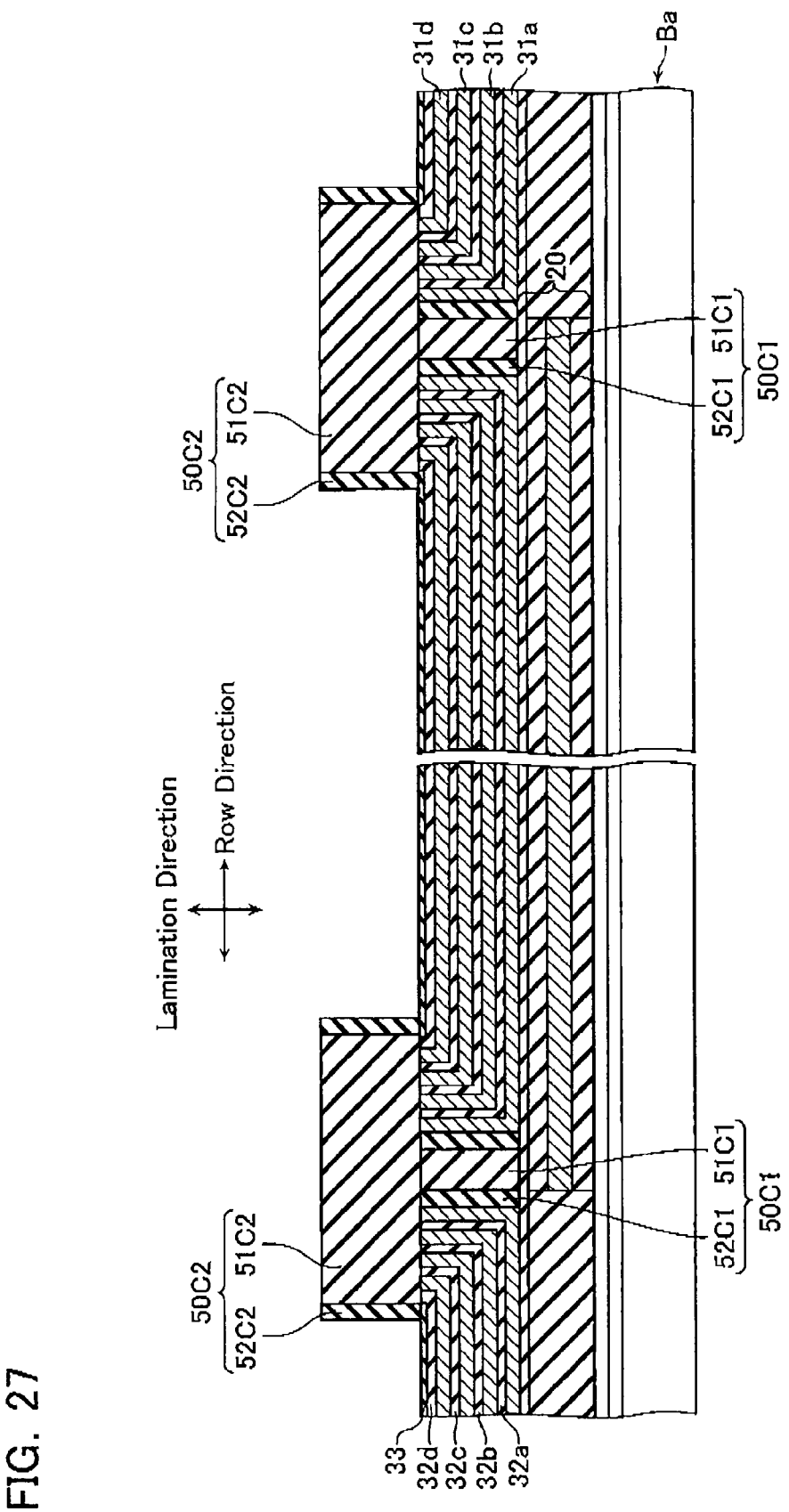
FIG. 27 is a cross-sectional view of the non-volatile semiconductor storage device 100d in a manufacturing process according to the fifth embodiment.
Figure 28:
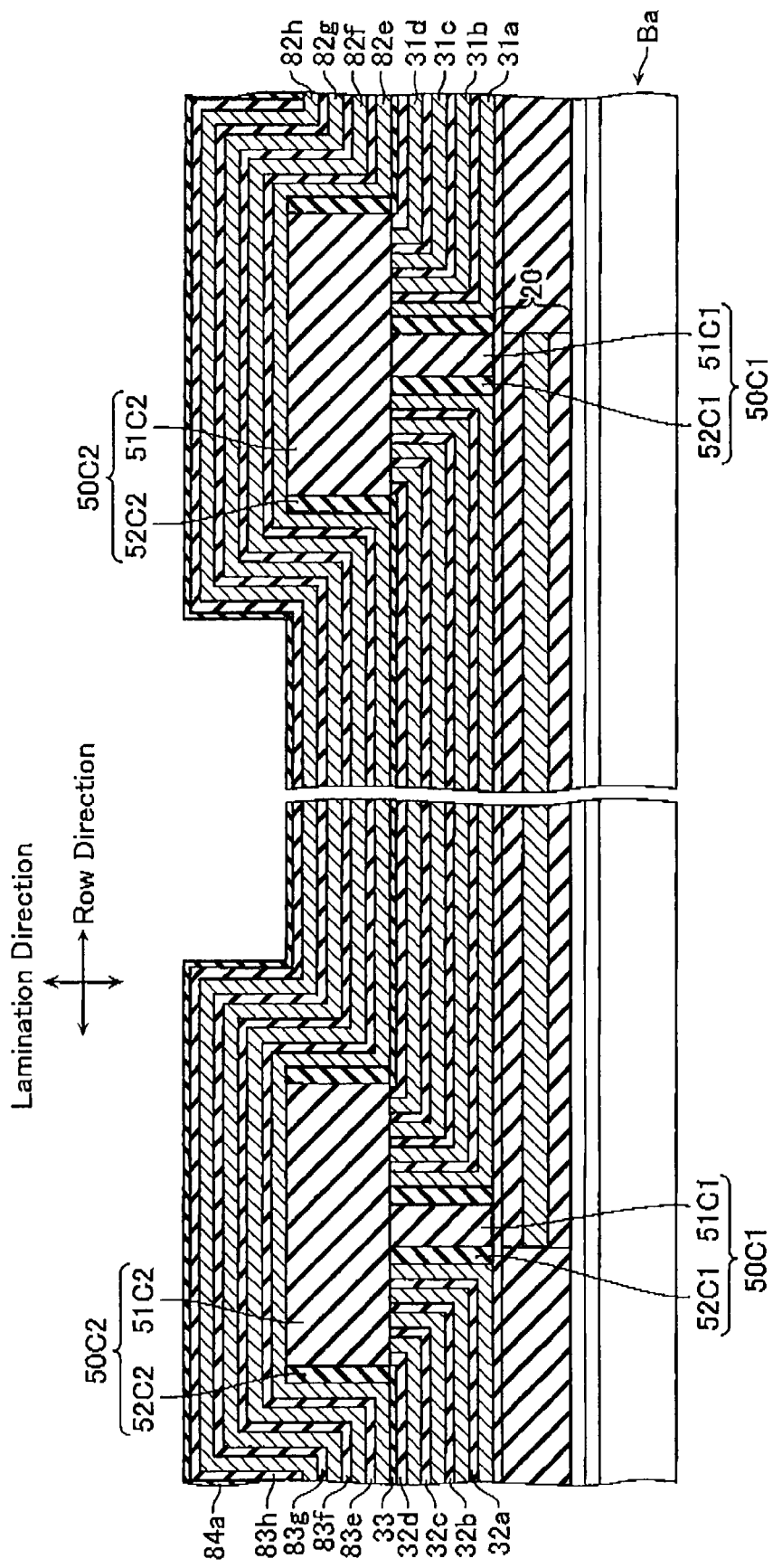
FIG. 28 is a cross-sectional view of the non-volatile semiconductor storage device 100d in the manufacturing process according to the fifth embodiment.
Figure 29:
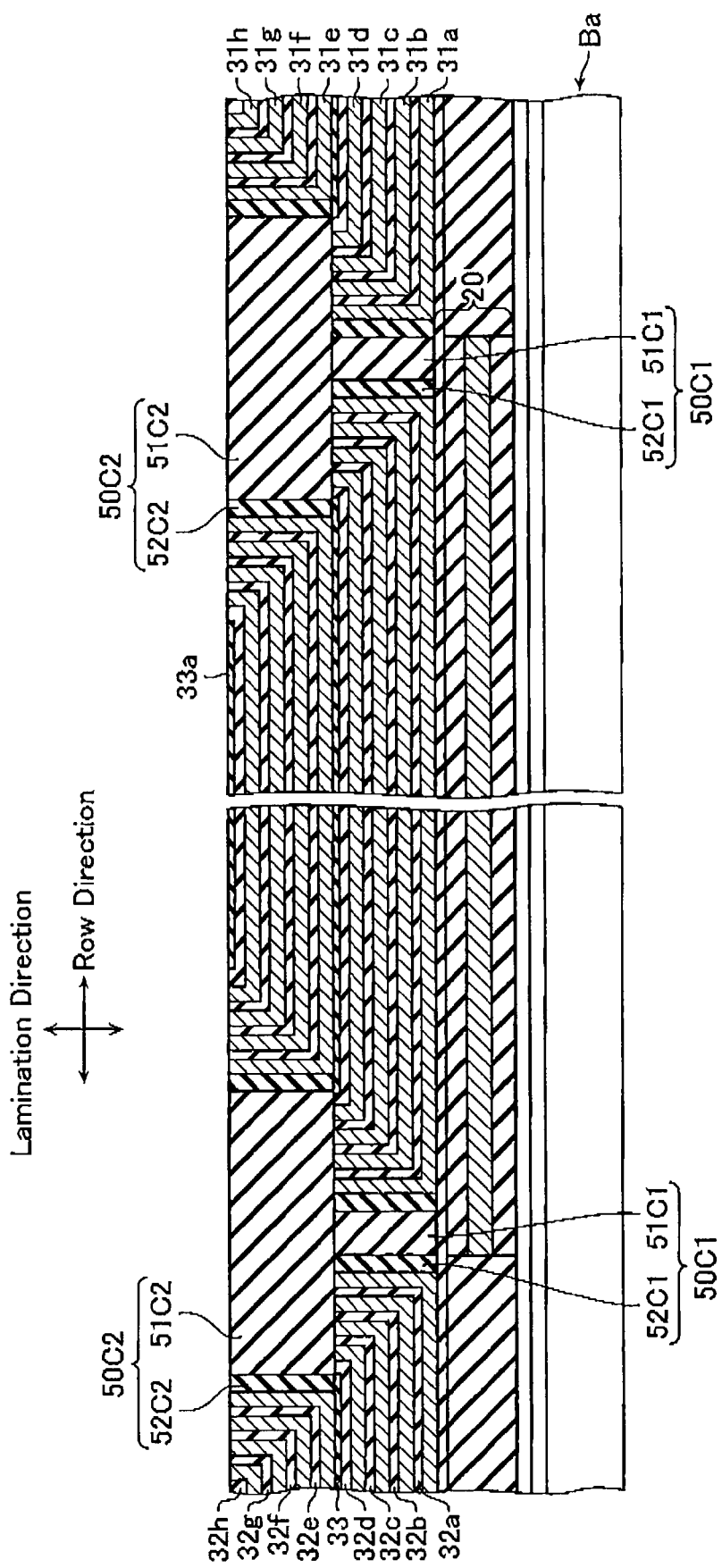
FIG. 29 is a cross-sectional view of the non-volatile semiconductor storage device 100d in the manufacturing process according to the fifth embodiment.

Manufacturing Process of Non-Volatile Semiconductor Storage Device 100d in Fifth Embodiment Referring now to FIGS. 27 to 29, the manufacturing process of the non-volatile semiconductor storage device 100d according to the fifth embodiment will be described below. FIGS. 27 to FIG. 29 are cross-sectional views in the row direction of the non-volatile semiconductor storage device 100d in the manufacturing process according to the fifth embodiment.

Firstly, the steps of FIGS. 8 to 11A and 11B in the first embodiment are executed. Note that the protruding layers 50 formed in the steps of FIGS. 8 to 11A and 11B in the first embodiment function as the first protruding layers 50C1 in the fifth embodiment.

Then, as illustrated in FIG. 27, second protruding layers 50C2 are formed on the top surfaces of the first protruding layers 50C1. In this case, the widths in the row direction of the second protruding layers 50C2 are set to be greater than the widths of the first protruding layers 50C1 in the row direction. This means that such protruding layers 50C are formed through the step of FIG. 27 where the first protruding layers 50C1 and the second protruding layers 50C2 are formed in a stepwise manner in relation to each other so that a higher layer has a larger width in the row direction than a lower one.

Then, as illustrated in FIG. 28, polysilicon (p-Si) and silicon oxide (SiO$_2$) are alternately laminated over the top surface of the memory isolation/insulation layer as well as the top and side surfaces the second protruding layers 50C2, after which silicon nitride (SiN) is deposited thereon. Through this process, fifth to eighth polysilicon layers 82e to 82h, fifth to eighth silicon oxide layers 83e to 83h, and a silicon nitride layer 84a are formed.

Then, as illustrated in FIG. 29, the fifth to eighth polysilicon layers 82e to 82h, the fifth to eighth silicon oxide layers 83e to 83h, and the silicon nitride layer 84a are polished to the top surfaces of the second protruding layers 50C2 by CMP. Through this process, the fifth to eighth polysilicon layers 82e to 82h provide the fifth to eighth word-line conductive layers 31e to 31h. The fifth to eighth silicon oxide layers 83e to 83h provide the fifth to eighth inter-wordline insulating layers 32e to 32h. The silicon nitride layer 84a provides the memory isolation/insulation layer 33a. Note that during the CMP process illustrated in FIG. 29, the sidewall layers 52C2 (silicon nitride) of the second protruding layers 50C2 server as CMP stoppers. After the step of FIG. 29, and through the subsequent steps described in the first embodiment, the non-volatile semiconductor storage device 100d of the fifth embodiment is formed as illustrated in FIGS. 25 and 26.

Advantages of Non-Volatile Semiconductor Storage 100d Device in Fifth Embodiment Advantages of the non-volatile semiconductor storage device 100d according to the fifth embodiment will now be described below. The non-volatile semiconductor storage device 100d of the fifth embodiment has substantially the same configuration as the first embodiment. Therefore, the non-volatile semiconductor storage device 100d of the fifth embodiment has the same advantages as described in the first embodiment.

The non-volatile semiconductor storage device 100d of the fifth embodiment has the fifth to eighth word-line conductive layers 31e to 31h, in addition to the first to fourth word-line conductive layers 31a to 31d of the first embodiment. Therefore, the non-volatile semiconductor storage device 100d of the fifth embodiment has a more integrated structure than the first embodiment.

Other Embodiments

While embodiments of a non-volatile semiconductor storage device have been described, the present invention is not intended to be limited to the disclosed embodiments, and various other changes, additions, substitutions or the like may be made thereto without departing from the spirit of the invention.

For example, according to the fifth embodiment, the memory transistor layer 30D has the first to eighth word-line conductive layers 31a to 31h provided therein. In addition, the protruding layers 50C are formed in a stepwise manner in relation to each other so that a higher layer has a larger width in the row direction than a lower one. Furthermore, each of the protruding layers 50C includes a first protruding layer 50C1 and a second protruding layer 50C2 (two-stage stepwise configuration). The present invention, however, is not limited to the configuration of the fifth embodiment. The memory transistor layer may further comprise more (nine or more) word-line conductive layers. The protruding layers should not necessarily be formed in a two-stage stepwise manner, and may be formed in more (three or more) stages.

For example, the configuration of the memory transistor layer 30B and the protruding layers 50B in the third embodiment is also applicable to that of the second, fourth and fifth embodiments.

What is claimed is:

1. A non-volatile semiconductor storage device comprising:
   a memory string including a plurality of electrically rewritable memory cells connected in series; and
   a protruding layer formed to protrude upward with respect to a substrate,
   the memory string comprising:
      a plurality of first conductive layers laminated on the substrate and functioning as control electrodes of the memory cells;
      a first semiconductor layer formed to penetrate the plurality of first conductive layers and functioning as a body of each of the memory cells; and
      an electric charge storage layer formed between the first conductive layers and the first semiconductor layer, and configured to be able to store electric charges to retain data of the memory cells,
   each of the plurality of first conductive layers comprising:
      a bottom portion extending in parallel to the substrate; and
      a side portion extending upward with respect to the substrate along the protruding layer at the bottom portion,
   the protruding layer having a width in a first direction parallel to the substrate that is less than or equal to its length in a lamination direction.

2. The non-volatile semiconductor storage device according to claim 1, wherein
   the protruding layer is formed in a trapezoid shape; and
   the side portion is formed to extend upward at a predetermined inclination angle to the substrate along the protruding layer.

3. The non-volatile semiconductor storage device according to claim 1, wherein
   the plurality of first conductive layers are formed to surround the protruding layer.

4. The non-volatile semiconductor storage device according to claim 1, wherein
   the protruding layers are formed in a stepwise manner in relation to each other so that a higher layer has a larger width in the first direction than a lower one.

5. The non-volatile semiconductor storage device according to claim 1, wherein
   the plurality of first conductive layers are configured to contain metal.

6. The non-volatile semiconductor storage device according to claim 1, wherein
   the protruding layers are formed at a predetermined pitch in the first direction and a second direction orthogonal to the first direction.

7. The non-volatile semiconductor storage device according to claim 1, wherein
   the protruding layer is formed in a rectangular shape as viewed from above.

8. The non-volatile semiconductor storage device according to claim 1, wherein
   the plurality of first conductive layers are formed in concave shapes with upward apertures.

9. The non-volatile semiconductor storage device according to claim 1, further comprising:
   a first selection transistor connected to one end of the memory string, wherein the first selection transistor comprises:
- a second conductive layer formed below a bottommost one of the first conductive layers and functioning as a control electrode of the first selection transistor;
- a second semiconductor layer formed to penetrate the second conductive layer and in contact with the bottom surface of the first semiconductor layer, the second semiconductor layer functioning as a body of the first selection transistor; and
- a first gate insulation layer formed between the second conductive layer and the second semiconductor layer.

10. The non-volatile semiconductor storage device according to claim 1, further comprising:
   a second selection transistor connected to the other end of the memory string,
   wherein the second selection transistor comprises:
   - a third conductive layer formed above a topmost one of the first conductive layers and functioning as a control electrode of the second selection transistor;
   - a third semiconductor layer formed to penetrate the third conductive layer and in contact with a top surface of the first semiconductor layer, the third semiconductor layer functioning as a body of the second selection transistor; and
   - a second gate insulation layer formed between the third conductive layer and the third semiconductor layer.

11. The non-volatile semiconductor storage device according to claim 1, wherein
   the protruding layer comprises:
   - a columnar layer formed in a columnar shape, the columnar layer including silicon oxide; and
   - a sidewall layer formed on a sidewall of the columnar layer, the sidewall layer including silicon nitride.

12. The non-volatile semiconductor storage device according to claim 1, further comprising:
   - an interlayer insulation layer formed above the first conductive layers; and
   - a first contact plug layer formed to penetrate the interlayer insulation layer and to reach a top surface of the side portion of each of the first conductive layers.

13. The non-volatile semiconductor storage device according to claim 9, further comprising:
   - an interlayer insulation layer formed above the protruding layer; and
   - a second contact plug layer formed to penetrate the interlayer insulation layer and the protruding layer and to reach a top surface of the second conductive layer.

* * * * *